(12) United States Patent
Zhang et al.

(10) Patent No.: US 11,683,913 B2
(45) Date of Patent: Jun. 20, 2023

(54) MULTIPLE SUPPLY AND RETURN CONNECTIONS FOR LIQUID COOLING LOOP ASSEMBLIES

(71) Applicant: Google LLC, Mountain View, CA (US)

(72) Inventors: Feini Zhang, Fremont, CA (US); Madhusudan K. Iyengar, Foster City, CA (US); Reza H. Khiabani, San Mateo, CA (US)

(73) Assignee: Google LLC, Mountain View, CA (US)

( * ) Notice: Subject to any disclaimer, the term of this patent is extended or adjusted under 35 U.S.C. 154(b) by 73 days.

(21) Appl. No.: 17/157,373

(22) Filed: Jan. 25, 2021

(65) Prior Publication Data

US 2022/0240421 A1    Jul. 28, 2022

(51) Int. Cl.
*H05K 7/20* (2006.01)

(52) U.S. Cl.
CPC ............... *H05K 7/20772* (2013.01)

(58) Field of Classification Search
None
See application file for complete search history.

(56) References Cited

U.S. PATENT DOCUMENTS

| | | | |
|---|---|---|---|
| 8,164,901 B2 | 4/2012 | Neudorfer | |
| 8,824,143 B2* | 9/2014 | Campbell | H05K 7/20836 361/699 |
| 9,854,715 B2 | 12/2017 | Shedd et al. | |
| 10,225,958 B1 | 3/2019 | Gao | |
| 10,238,010 B2 | 3/2019 | Shelnutt et al. | |
| 10,548,242 B2 | 1/2020 | Cader et al. | |
| 11,206,745 B2* | 12/2021 | Gao | H05K 7/1497 |
| 11,252,844 B2* | 2/2022 | Shao | H05K 7/1489 |
| 2007/0297136 A1* | 12/2007 | Konshak | H05K 7/20781 361/699 |
| 2010/0103618 A1 | 4/2010 | Campbell et al. | |
| 2011/0056674 A1 | 3/2011 | Campbell et al. | |
| 2014/0124167 A1 | 5/2014 | Campbell et al. | |
| 2015/0189796 A1* | 7/2015 | Shedd | F28F 13/06 165/104.31 |
| 2016/0270259 A1 | 9/2016 | Chainer et al. | |
| 2019/0364699 A1 | 11/2019 | Gao | |
| 2020/0214164 A1 | 7/2020 | Doll et al. | |
| 2022/0071049 A1* | 3/2022 | Heydari | H05K 7/20272 |

(Continued)

OTHER PUBLICATIONS

Extended European Search Report for European Patent Application No. 21211004.3 dated May 25, 2022. 10 pages.

*Primary Examiner* — Courtney L Smith
(74) *Attorney, Agent, or Firm* — Lerner David LLP

(57) ABSTRACT

A system includes a central supply line and a central return line connected to a fluid source of cooling liquid. A rack supply manifold is connected to the central supply line. A rack return manifold is connected to the central return line. A liquid cooling loop assembly may be coupled to at least one cooling device connected to a circuit board. Multiple inlet connectors may be connected to the rack supply manifold. Multiple outlet connectors may be connected to the rack return manifold. The multiple inlet connectors provide a passageway for the cooling liquid from the central supply line into the liquid cooling loop assembly for distribution to the at least one cooling device. The multiple outlet connectors provide a passageway to the rack return manifold for the cooling liquid exiting the at least one cooling device.

18 Claims, 20 Drawing Sheets

(56) References Cited

U.S. PATENT DOCUMENTS

| | | | |
|---|---|---|---|
| 2022/0071063 A1 | 3/2022 | Heydari | |
| 2022/0087075 A1* | 3/2022 | Heydari | G06N 3/0454 |
| 2022/0095476 A1* | 3/2022 | Heydari | H05K 7/20772 |
| 2022/0104403 A1* | 3/2022 | Heydari | H05K 7/20381 |
| 2022/0110223 A1* | 4/2022 | Heydari | H05K 7/20836 |
| 2022/0117119 A1* | 4/2022 | Heydari | A61L 2/10 |
| 2022/0151114 A1* | 5/2022 | Heydari | H05K 7/208 |

\* cited by examiner

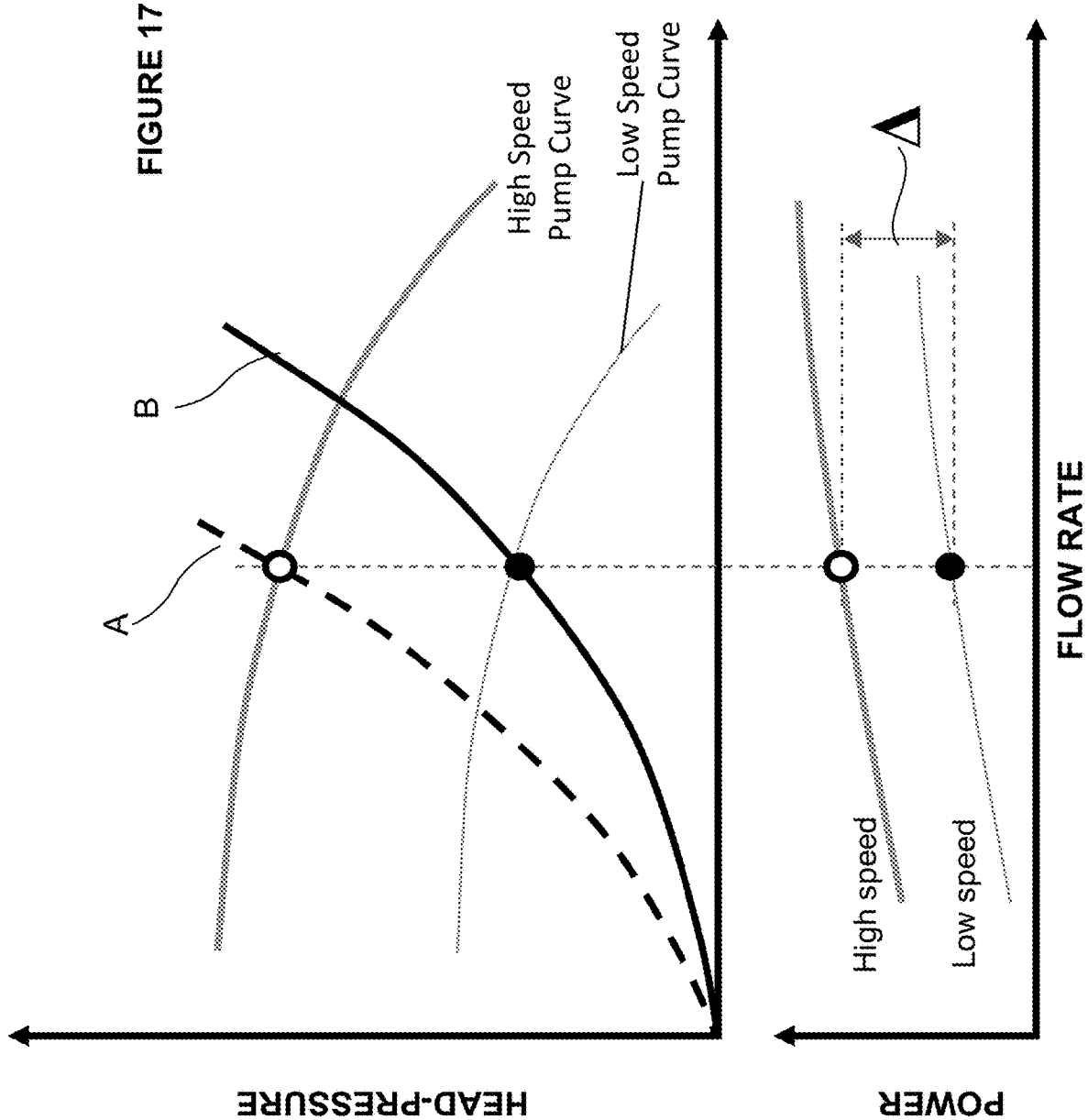

MULTIPLE SUPPLY AND RETURN CONNECTIONS FOR LIQUID COOLING LOOP ASSEMBLIES

BACKGROUND

This application relates to the field of electronics, and particularly thermal management and cooling of chip assemblies utilizing liquid cooling. Liquid cooling can be used within computing equipment and on data center racks to aid in the reduction of heat generated by microelectronic elements within the chip assemblies, as well as heat generated by components external to the assembly.

Corporations operating large-scale computing systems invest significant amounts of capital to establish and maintain the equipment comprising the computing systems. These computing systems are typically stored in data centers, which require expensive hardware and equipment, as well as real estate and personnel to maintain the equipment stored in the data centers. To minimize costs, data center racks and the equipment thereon are designed to be compact and capable of functioning over extended periods of time, as well as modular to accommodate changing architecture and configuration of components within the computing system.

Given the high power outputs of each computing system, as well as the other equipment in the data rack and in the data center, high levels of heat are generated. Significant heat within and around the computing systems threaten the lifespan and operation of the computing system.

Liquid cooling is one method in which to remove heat in the system and to maintain components, such as chip assemblies and microprocessors, within the system within operating temperature limits. Liquid cooling allows for removal of the excess heat with heat transfer fluid pumped into a cooling device and the heated return cooling liquid pumped out of the device.

BRIEF SUMMARY

According to aspects of the disclosure, a system for thermal management of computing devices comprises a central supply line coupled to a fluid source of cooling liquid; a central return line coupled to the fluid source; a rack supply manifold coupled to the central supply line; a rack return manifold coupled to the central return line; and a loop assembly coupled to the rack supply manifold and the rack return manifold. The cooling loop assembly can be coupled to at least one cooling device that is electrically connected to a circuit board, the cooling loop assembly further comprising multiple inlet connectors connected to the rack supply manifold; and multiple outlet connectors connected to the rack return manifold. The multiple inlet connectors may provide a passageway for the cooling liquid from the central supply line into the cooling loop assembly for distribution to the at least one cooling device. The multiple outlet connectors may provide a passageway to the rack return manifold for the cooling liquid exiting the at least two of the cooling devices.

In one example, each multiple inlet connector may be coupled to a board supply line that feeds fluid from the rack supply manifold into the cooling loop assembly and into the at least one cooling device. The cooling loop assembly can further comprise a board inlet manifold and secondary supply lines. The secondary supply lines may connect the board inlet manifold to the at least one cooling device.

In another example, the cooling loop assembly can additionally or alternatively comprise board return lines coupled to each multiple outlet connector. The cooling liquid may return from the at least one cooling device flows through each of the board return lines and the multiple outlet connectors. Additionally or alternatively, the cooling loop assembly can comprise a board outlet manifold and secondary return lines connecting the multiple outlet connectors to the board outlet manifold.

In another example, the at least one cooling device is two or more cooling devices, and the multiple inlet connectors are at least two inlet connectors. Additionally, in some examples, the multiple outlet connectors may be at least two outlet connectors. In some examples, the rack supply manifold and the rack return manifold may be positioned on opposed sides of the two or more cooling devices. In other examples, the rack supply manifold and the rack return manifold are positioned on a same side of the two or more cooling devices.

According to another example of this aspect, the multiple inlet connectors and the multiple outlet connectors are first multiple inlet connectors and first multiple outlet connectors. The cooling loop assembly may be a first cooling loop assembly and the system may further include a second cooling loop assembly coupled to the rack supply manifold and rack return manifold. The first cooling loop assembly may overlie the second cooling loop assembly. The second cooling loop assembly may be coupled to at least one other cooling device connected to another circuit board.

In another example, the rack supply manifold may be a first rack supply manifold and the rack return manifold may be a first rack return manifold. The system may further comprise a second central supply line; a second central return line; a second rack supply manifold coupled to the second central supply line; and a second rack return manifold coupled to the second central return line. At least one of the multiple inlet connectors may be connected to the second rack supply manifold. At least one of the multiple outlet connectors may be connected to the second rack return manifold. The at least one of the multiple inlet connectors may provide a passageway for the cooling liquid from the second central supply line into the cooling loop assembly for distribution to the at least one cooling device. The at least one of the multiple outlet connectors provide a passageway to the second rack return manifold for the cooling liquid to exit the at least one of the cooling devices.

The multiple inlet connectors and the multiple outlet connectors may comprise quick disconnect couplings.

According to another aspect of the disclosure, a system comprises a circuit board; a plurality of microelectronic assemblies electronically connected to the circuit board; a plurality of cooling devices; and a cooling loop assembly. The plurality of cooling devices may overlie a first microelectronic assembly and a second microelectronic assembly of the plurality of microelectronic assemblies and be configured to cool the first and second microelectronic assemblies. The cooling loop assembly may be coupled to the plurality of the cooling devices and overlie the circuit board. The cooling loop assembly can comprise multiple inlet connectors configured to be coupled to an assembly fluid source external to the circuit board; and multiple outlet connectors configured to be coupled to an assembly return line external to the circuit board. The multiple inlet connectors provide a passageway for cooling liquid from the assembly fluid source into the cooling loop assembly for distribution to the at least two of the cooling devices. The multiple outlet connectors may provide a passageway to the assembly return line for the cooling liquid exiting the at least two of the cooling devices.

In one example, each of the multiple inlet connectors is attached to a board supply line overlying the circuit board and that feeds fluid into the cooling loop assembly and into the at least two of the cooling devices. Additionally, an outlet return line may overlie the circuit board and be connected to each of the multiple outlet connectors. The cooling liquid returning from each of the at least two of the cooling devices may flow through each of the outlet return lines and the multiple outlet connectors. Additionally, the inlet connectors and outlet connectors are quick disconnect couplings and the outlet connectors are quick disconnect couplings.

According to another aspect of the disclosure, a system for thermal management of computing devices comprises a rack supply manifold connected to a supply line; a rack return manifold connected to a central return line; and a first cooling loop assembly and a second cooling loop assembly coupled to the rack supply manifold and the rack return manifold. The first cooling loop assembly may be coupled to at least one cooling device that is electrically connected to a circuit board. The first cooling loop assembly comprises at least one inlet connector coupled to the rack supply manifold. The at least one inlet connector provides a passageway for cooling liquid from the rack supply manifold into the first cooling loop assembly for distribution to the at least one cooling device. At least one outlet connector may be coupled to the rack return manifold. The at least one outlet connector may provide a passageway for cooling liquid exiting the at least one cooling device to the rack return manifold. At least one of the at least one inlet connector and the at least one outlet connector is a plurality of inlet connectors or outlet connectors. The second cooling loop assembly may be coupled to at least one other cooling device connected to the circuit board. The second cooling loop assembly may comprise at least one inlet connector of the second cooling loop assembly coupled to the rack supply manifold; and at least one outlet connector of the second cooling loop assembly coupled to the rack return manifold. The at least one inlet connector may provide a passageway for the cooling liquid from the rack supply manifold into the second cooling loop assembly for distribution to the at least one other cooling device. The at least one outlet connector may provide a passageway to the rack return manifold for the cooling liquid exiting the at least one other cooling device. At least one of the at least one inlet connector and the at least one outlet connector of the second cooling loop assembly is a plurality of inlet connectors or outlet connectors.

In one example, the at least one connector of the first cooling loop assembly and the at least one connector of the second cooling loop assembly comprise a plurality of inlet connectors.

BRIEF DESCRIPTION OF THE DRAWINGS

The accompanying drawings are not intended to be drawn to scale. Similar reference numbers and designations in the various drawings indicate like elements. For purposes of clarity, not every component may be labeled in every drawing. In the drawings:

FIG. 17 is a head versus flow rate graph and a power versus flow rate chart illustrating differences between prior art cooling systems and aspects of the disclosure.

DETAILED DESCRIPTION

Liquid cooling systems and cold plates are used to dissipate heat within chip assemblies, computing systems, and data server rack systems. Liquid cooled processors require higher coolant flow rate to maintain the computing performance and system reliability. As chip power increases, liquid flow rate must also increase to keep up with increased heat created by the chips. This can lead to significant rise in pressure drop through connections for cooling loop assemblies. Further, pumping power consumed by pressure drop in connectors does not contribute to cooling.

To address the shortcomings associated with supplying a higher flow rate at increased power and cost, an improved liquid cooling system is disclosed. In accordance with aspects of the disclosure, the improved cooling system can include a single cooling loop with multiple quick disconnects provided at the supply interface and multiple disconnects provided at the return interface. This allows for the lowest pressure drop through the connections and the cooling loop, versatility, and a design that is easily scalable for increased number of supply and returns. Additionally, it can prevent mechanical conflict in the machine due to prior art single supply and return hoses.

Figure 1:
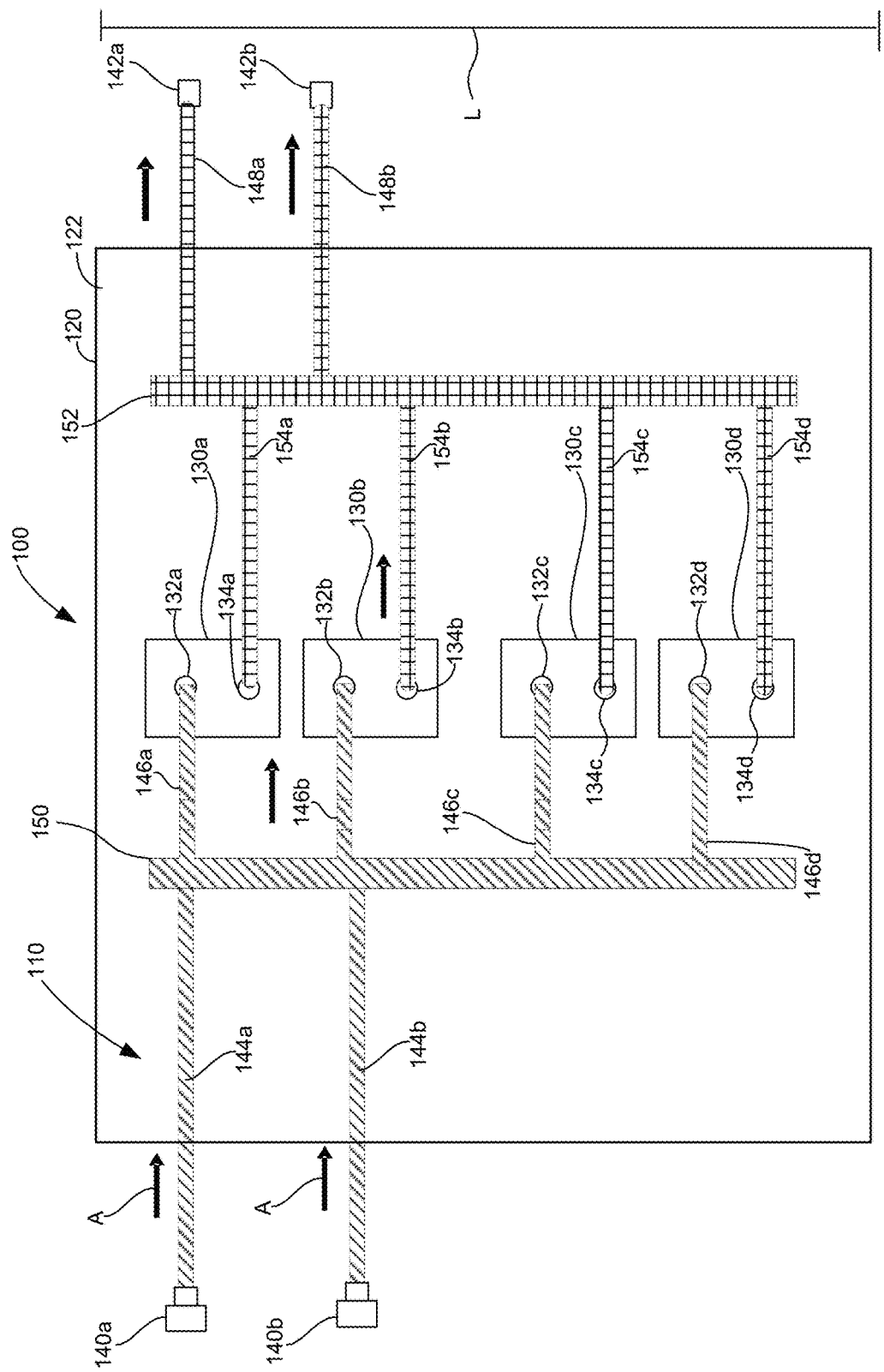
FIG. 1 is a schematic top view of an example system comprising a computing device and cooling loop assembly according to aspects of the disclosure.

FIG. 1 is an example system 100 that includes a cooling loop assembly 110 with multiple inlets and multiple outlets for thermal management and liquid cooling of microelectronic assemblies, including chips, such as semiconductor chips, or other devices (not shown) on a circuit board 120 of a computing device 122. The circuit board 120 may include a motherboard, main board or the like. In this example, the cooling loop assembly 110 may be the only loop implemented on the circuit board 120 for cooling all components connected to the cooling loop assembly 110 on the circuit board 120, but the cooling loop assembly 110 can be implemented with other loops on the circuit board 120, as well. In this example, cooling loop assembly 110 is fluidly connected to each of the cooling devices 130a,130b, 130c, 130d on the circuit board 120. Each cooling device 130a, 130b, 130c,130d may include a respective inlet 132a, 132b, 132c, 132d and a corresponding outlet 134a, 134b, 134c, 134d. Cooling loop assembly 110 and corresponding computing device 122 may be one of a plurality of cooling loops and computing devices in a data center server rack (see FIG. 2), but in other examples the cooling loop may be utilized for a standalone individual computing device and cooling loop.

Cooling loop assembly 110 may include at least two inlet connectors: a first inlet connector 140a and a second inlet connector 140b, but a single inlet connection or more than two inlet connectors may also be utilized. Cooling loop assembly 110 further includes at least two outlet connectors: a first outlet connector 142a and a second outlet connector 142b, but a single outlet connector or more than two outlet connectors may also be utilized. In this example, first and second inlet connectors 140a, 140b may be coupled or connected to a single liquid cooling inlet source or manifold (not shown in this view) of a larger cooling system (see FIG. 3), and first and second outlet connectors may be coupled or connected to a single liquid cooling outlet or manifold (not shown in this view).

The first and second inlet connectors 140a,140b, as well as the first and second outlet connectors 142a, 142b may be quick disconnect couplings or fittings that are designed to provide fast and easy connection and disconnection of lines to the respective inlet source and outlet source. Examples of quick disconnect fittings can include snap type (spring loaded ball latching), non-latching, double shut-off, and dry break quick disconnect fittings. Utilizing quick disconnect fittings can provide a higher pressure drop than simpler or other types of mechanical fittings. Further, quick disconnect fittings do not require the use of tools to assemble and disassemble. In other examples, different types of connectors may be utilized, such as quick connectors.

A first board supply line 144a connects the first inlet connector 140a to the board inlet manifold 150 and a second board supply line 144b connects the second inlet connector 140b to the board inlet manifold 150. Cooling liquid is distributed across the circuit board 120 along a length of the board inlet manifold 150. This enables cooling liquid to reach and be distributed to each of the cooling devices 130a,130b, 130c,130d. As shown, the board inlet manifold 150 is positioned adjacent at least one of the edges of each of the cooling devices 130a,130b,130c,130d. But, in other examples, the board inlet manifold 150 can be positioned anywhere on the circuit board 120 and may be any shape or size. Secondary supply lines 146a,146b,146c,146d may extend from the board inlet manifold 150 to the inlets 132a, 132b, 132c, 132b of each respective cooling device 130a, 130b,130c,130d.

A first return line 148a joins the first outlet connector 142a to the board outlet manifold 152 and a second return line 148b joins the second outlet connector 142b to the board outlet manifold 152. The board outlet manifold 152 can run parallel to the board inlet manifold 150 and in this example, extends along a length L of the circuit board and adjacent at least one edge of each of the cooling devices 130a,130b, 130c, 130d. Secondary return lines 154a,154b,154c,154d extend between the board outlet manifold 152 and each of the outlets 134a,134b,134c,134d of the respective cooling devices 130a,130b,130c,130d.

The supply and return lines, as well as any secondary supply and return lines and manifolds may be hoses, pipes, or other structures that enable fluid to move from a liquid source through the inlet connections, through the cooling loop assembly and cooling devices, and back out through the return lines to an outlet. In some examples, the supply and return lines may be flexible hoses or pipes to allow for easier user handling. In other examples, the supply and return lines may be more rigid to better allow for automation of the connection and disconnection of the return and supply lines. In still other examples, the system may incorporate both flexible and rigid lines.

The cooling devices 130a,130b,130c,130d may be conventional liquid cooling devices, such as cold plates or other devices that can be used in connection with liquid cooling of a chip, or microelectronic element, device, or assembly. The cooling devices 130a,130b,130c,130d are shown having an identical configuration, but in other examples, one or more of the cooling devices 130a,130b,130c,130d may differ. Further, the cooling devices 130a,130b,130c,130d may be arranged in any configuration, and any number of cooling devices may be arranged in the system.

The loop assembly 110 may continually pump cooling liquid through the inlet supply lines and heated return cooling liquid through the outlet lines. The cooling liquid may be any known cooling liquid from a continuous source of cooling liquids or a chiller system. Cooling liquid may include, for example, water, deionized water, inhibited glycol and water solutions, dielectric fluids, and any suitable cooling liquid.

During operation, cooling liquid from a primary source, such as a rack supply manifold 164 (see FIG. 2), can enter the loop assembly 110 through the first and second inlets of the loop assembly 110 at the first and second quick disconnects 140a, 140b and first and second board supply lines 144a,144b in the direction shown by the arrows in the figure. Incoming cooling liquid, which will be represented by a diagonal cross-hatching pattern in the examples described herein, will then be dispersed along the length of the board inlet manifold 150, and into each of the secondary inlet lines 146a,146b,146c,146d. The flow of cooling liquid will continue through each of the secondary inlet lines 146a,146b, 146c,146d and into the inlets 132a,132b,132c,132d of the respective cooling devices 130a,130b,130c,130d. Heated surfaces of the cooling devices 130a,130b,130c,130d will heat and increase the temperature of the cooling liquid. Heated return cooling liquid, which will be represented by square cross hatching in the examples described herein, exits each cooling device 130a,130b,130c,130d through the respective cooling device outlets 134a,134b,134c,134d and flows to the board outlet manifold 152 through secondary outlet lines 154a,154b,154c,154d in the direction shown by the arrows. Heated return cooling liquid will be dispersed from the board outlet manifold 152 through first and second return lines 148a,148b and first and second outlet connectors 142a,142b, each of which are connected to a single primary outlet, such as rack return manifold (see FIG. 2). It is to be appreciated that the arrows used throughout the descriptions of the various examples herein indicate a direction of flow of liquid in the respective cooling loop assemblies.

Figure 2:
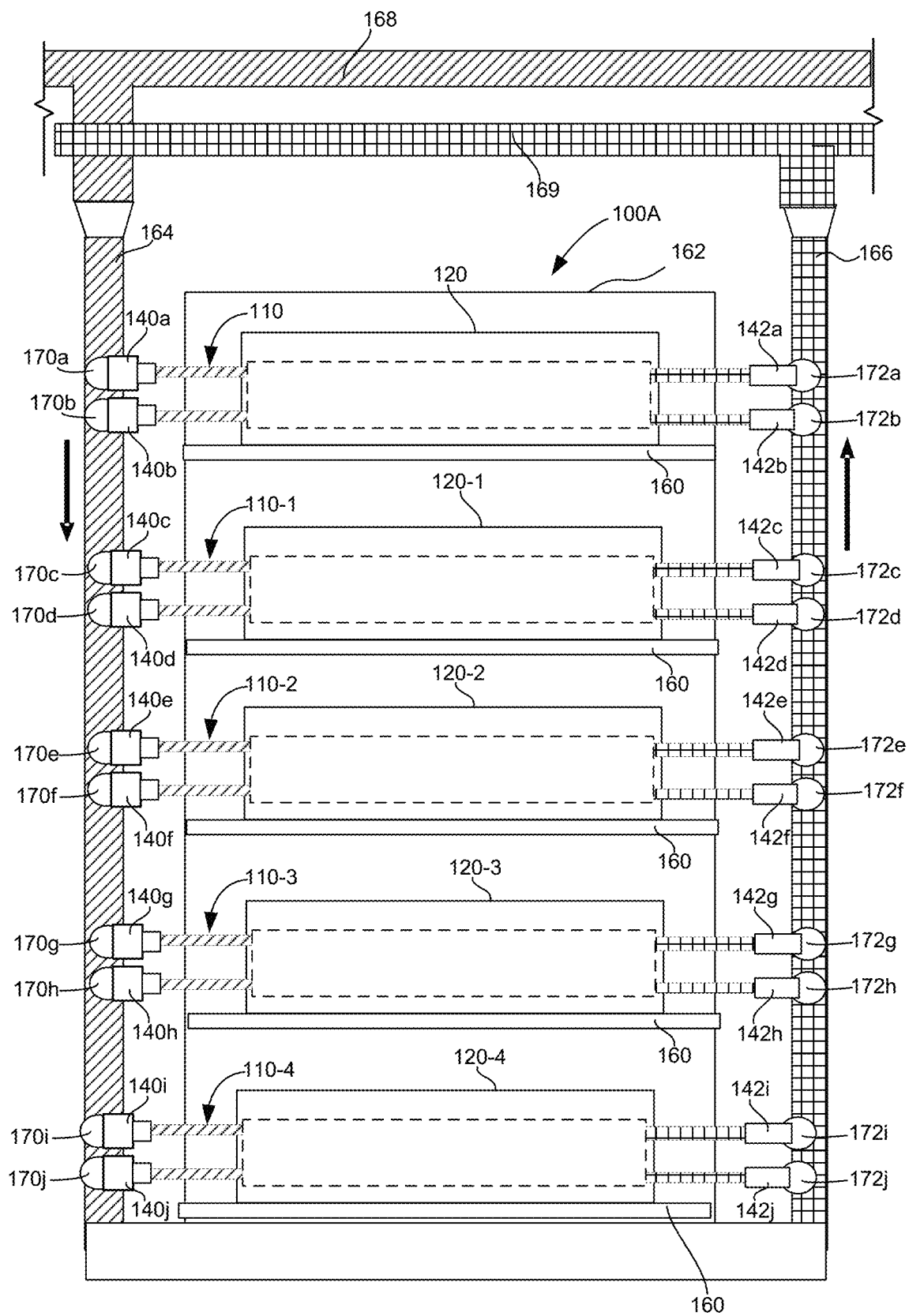
FIG. 2 is a schematic front view of an example system comprising the computing device and cooling loop assembly of FIG. 1 implemented within an example computing device rack, according to aspects of the disclosure.
Figure 3:
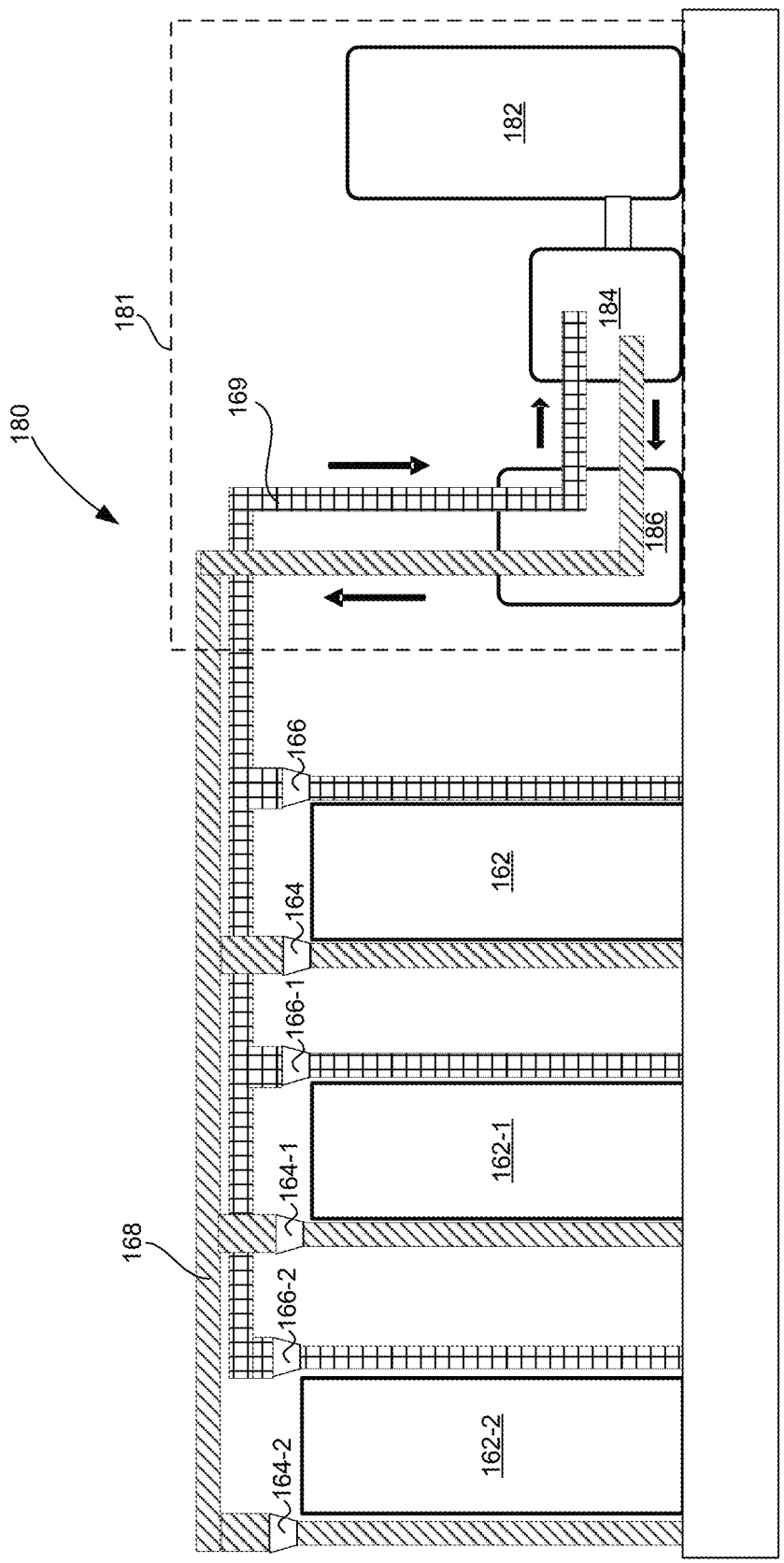
FIG. 3 is a schematic front view of an example cooling system that implements the computing device and cooling loop assembly of FIG. 2 according to aspects of the disclosure.

FIG. 2 is a schematic view showing an example system 100A that includes the first and second inlet connectors 140a,140b and first and second outlet connectors 142a,142b of primary cooling loop 110 and computing device 120 on a shelf 160 of a computing device rack 162. A plurality of other computing devices 120-1,120-2,120-3,120-4 and cooling loop assemblies 110-1, 110-2,110-3,110-4 are also shown on shelves 160 of the computing device rack 162. The computing device rack 162 in this example is one in a series of three computing device racks, as shown in FIG. 3, but in other examples, computing device rack 162 may be a single data rack connected to at least one cooling system, or may be one in a series of any number of racks connected to the at least one cooling system. FIG. 2 illustrates the multiple inlet and outlet connection points to the cooling liquid source and liquid return outlet. The racks and computing devices are shown in one arrangement, but any arrangement may be utilized.

A rack supply manifold 164 can extend the length of the computing device rack 162 and may be connected to a central cooling supply line 168. Rack supply manifold 164 can distribute cooling liquid from the central cooling liquid supply line 168 along the length of the entire rack 162 and provide a source of cooling liquid to each cooling loop assembly 110,110-1,110-2,110-3,110-4 of each respective computing device 120, 120-1, 120-2, 120-3,120-4. A rack return manifold 166 can similarly extend the length of the opposed side of the computing device rack 162, provide a return outlet for heated cooling liquid returning from the system, and pump liquid out of the computing device rack 162 and into a central return line 169 to return heated cooling liquid to a system source for cooling. The rack inlet and rack return manifolds 164,166 extend along the sides of the rack, but in other examples, one or both of the rack inlet and rack return manifolds can be positioned anywhere adjacent the computing device rack 162, including, for example, the front, rear, or on the same side of the server rack.

First inlet connector 140a of cooling loop assembly 110 is shown joined to a first rack inlet connection point 170a on the rack supply manifold 164 and a second inlet connector 140b of the cooling loop assembly 110 is joined to a second rack inlet connection point 170b on the rack supply manifold 164. First inlet connectors 140c, 140e, 140g,140i of the remaining cooling loop assemblies 110-1 through 110-4 are also joined to rack supply manifold 164 at respective first rack inlet connection points 170c, 170e, 170g,170i. Similarly, second inlet connectors 140d,140f,140h,140j are joined to rack supply manifold 164 at respective second rack inlet connection points 170d,170f, 170h,170j.

Second outlet connector 142a of cooling loop assembly 110 is shown joined to a first rack outlet connection point 172a on the rack return manifold 166, and a second outlet connector 142b of the cooling loop assembly 110 is joined to a second rack outlet connection point 172b on the rack outlet inlet manifold 164. First outlet connectors 142c, 142e, 142g,142i of the remaining cooling loop assemblies 110-1 through 110-4 are also joined to rack return manifold 166 at respective first rack outlet connection points 172c, 172e, 172g,172i. Similarly, second outlet connectors 142d,142f, 142h,142j are joined to rack return manifold 165 at respective second rack outlet inlet connection points 172d,172f, 172h,172j.

With reference to FIG. 3, a schematic coolant distribution system 180 comprises computing device rack 162, as one in a series of three data racks, but in other examples, any number of racks may be utilized. The coolant distribution system 180 can also comprise a central supply and return sub-system 181 includes a source or storage tank 182 of cooling liquid, chilling unit 184, central distribution unit 286, and central supply line 268 and central return line 269. The coolant distribution system 180 contains the pumping systems for coolant circulation, and cooling units to remove the heat from the coolant by transferring the heat to datacenter process water. System 180 can also be a standalone system that removes the heat from the coolant by transferring the heat to air through a fan coil or by transferring the heat to a refrigerant through a chiller system.

The coolant distribution system pumps and distributes cooling liquid through the central cooling liquid inlet line 168 and into each of the rack supply manifolds 164, 164-1,164-2 and each first and second connector (not shown) of each computing device (not shown) in the respective computing device racks 162, 162-1, 162-2. Heated return cooling liquid will exit the respective computing device racks 162, 162-1, 162-2 through the respective rack return manifolds 166, 166-1,166-2 and into the central cooling liquid outlet line 169 and back to the central distribution unit 186. The central distribution unit 186 will then pump the heated return cooling liquid into the cooling unit 184 where the heated return cooling liquid will be cooled and then circulated back into the central distribution unit 186 and pumped back into the system. It is to be appreciated that the components of the central supply and return sub-system 181 provides one example for cooling and distributing cooling liquid into the central inlet and outlet lines and throughout each of the racks 262,262-1,262-2, but numerous other examples may be used to accomplish the same features. For example, the lines may run underground, additional or fewer cooling components may be used.

Figure 4:
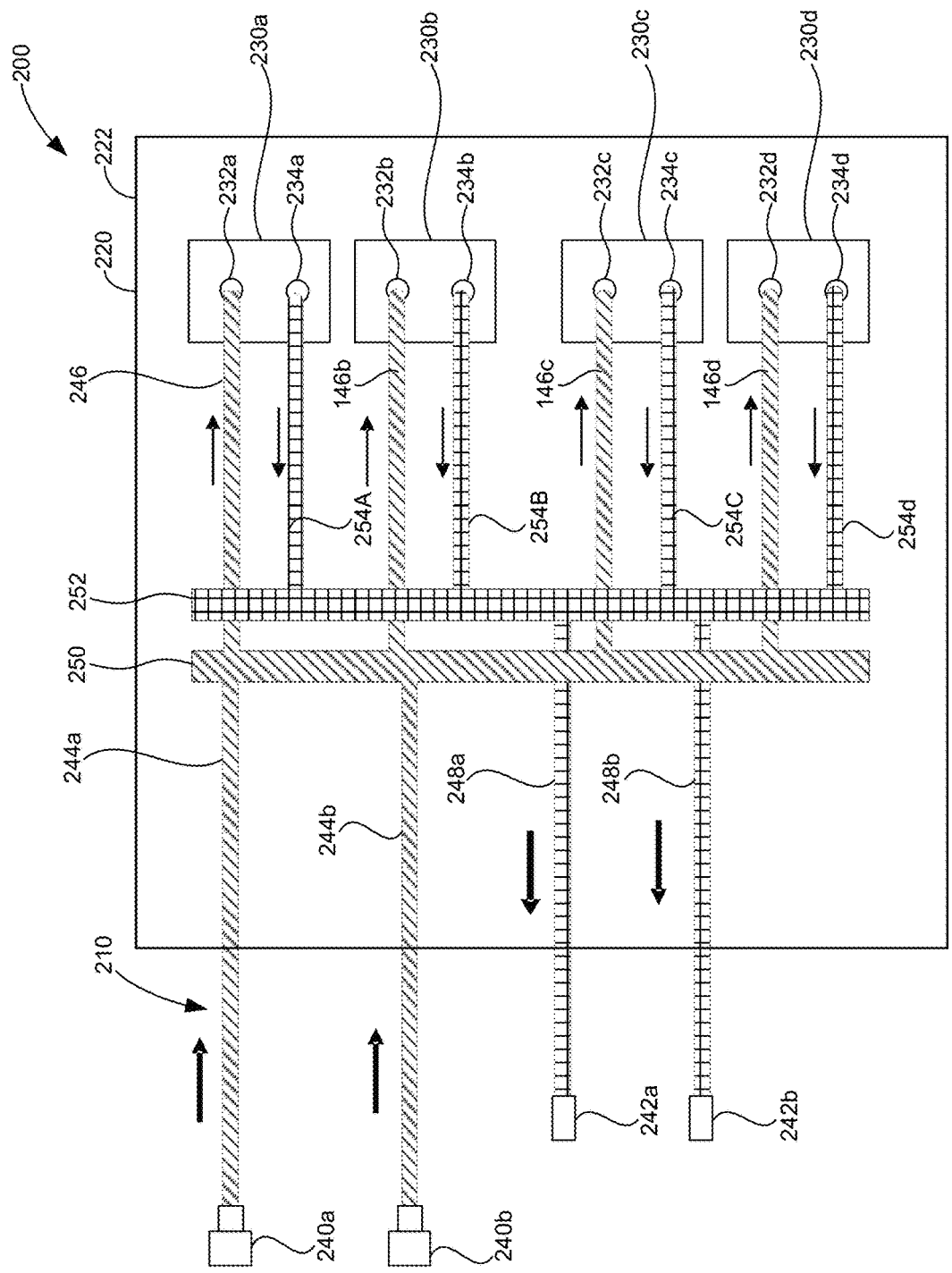
FIG. 4 is a schematic top view of an example system comprising a computing device and cooling loop assembly according to aspects of the disclosure.

Referring to FIG. 4, another schematic example 200 of a cooling loop assembly 210 is shown. This example is otherwise similar to the example of FIGS. 1-3, except that the first and second inlet connectors 240a,240b and the first and second outlet connectors 242a,242b, as well as the supply lines 2244a,244b, return lines 248,248b, secondary outlet lines 254a,254b,254c,254d, and the board outlet manifold 252 are positioned on the same side of the circuit board 220 of the computing device 222. As shown, the flow of cooling liquid through the cooling loop 210 will follow a circular pattern, as shown by the arrows, so as to allow for cooling liquid to return to the same side of the circuit board 220, instead of a more linear pattern from one end of the board to the other, as in the example of FIGS. 1-3. For example, cooling liquid from a rack supply manifold flows 264 (FIG. 5) flows through first and second inlet connectors 240a,240b and through first and second supply lines 244a, 244b to the board inlet manifold 250. Cooling liquid is distributed from the board inlet manifold 250 to inlets 232a,232b,232c,232d of cooling devices 230a,230b,230c, 230d through secondary inlet lines 246a,246b,246c,246d. Heated return cooling liquid will exit the cooling devices 230a,230b,230c,230d through their respective outlets 234a, 234b,234c,234d and flow to the board outlet manifold 252. First and second return lines 248a,248b will distribute cooling liquid from the board outlet manifold 252 to connectors 242a,242b and the rack return manifold 266.

Figure 5:
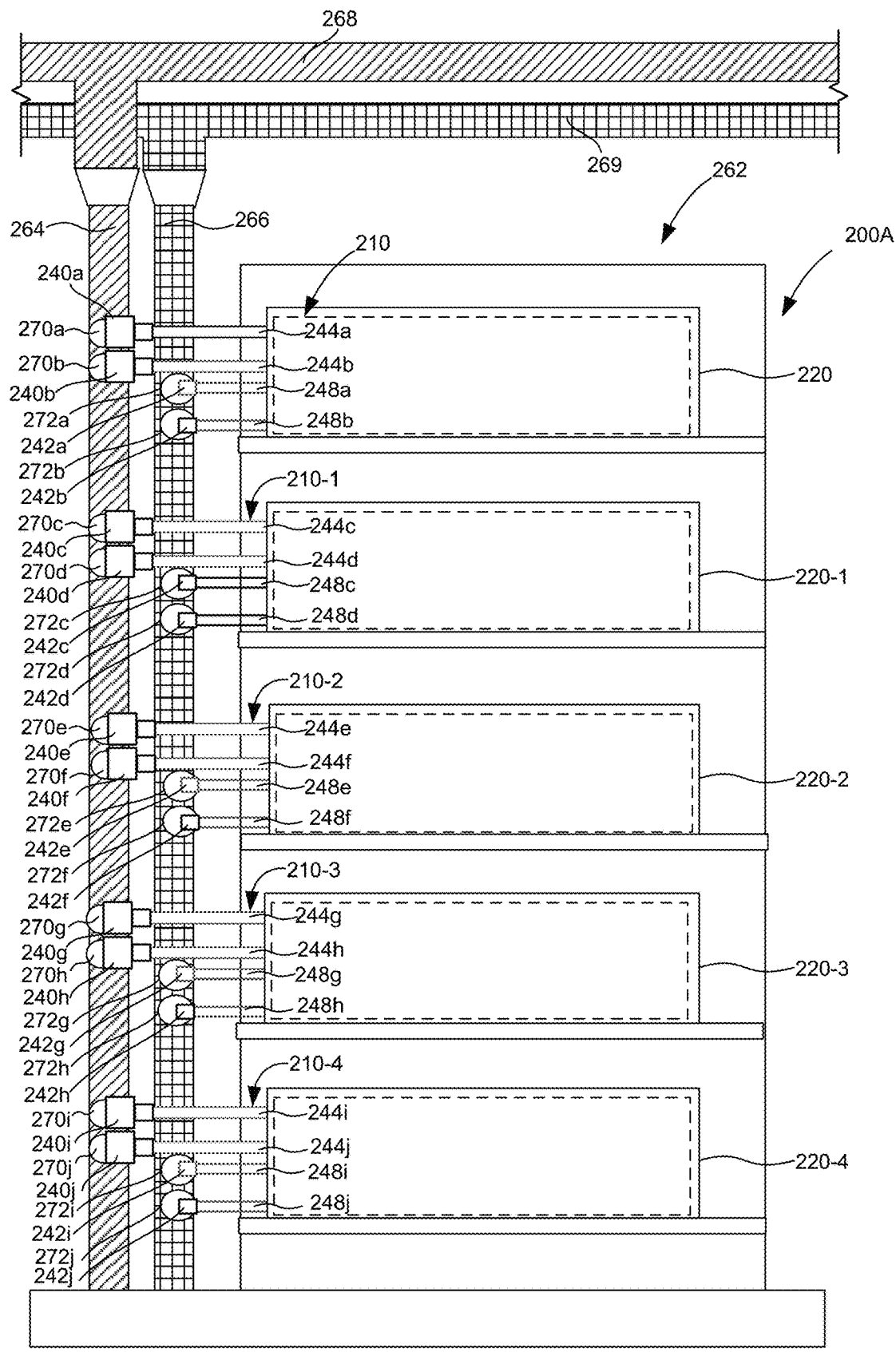
FIG. 5 is a schematic front view of an example system comprising the computing device and cooling loop assembly of FIG. 4 implemented within an example computing device rack, according to aspects of the disclosure.

As better seen in the example rack system 200A of FIG. 5, in this cooling loop 210 configuration, rack supply manifold 264 and rack return manifold 266 can be positioned directly adjacent one another and on the same side of computing device 220 and/or the cooling devices. Cooling loop assembly 210 and computing device 220 can be positioned on a shelf of computing device rack 262. First and second inlet connection points 270a,270b are positioned on the rack supply manifold 264, and first and second outlet connection points 272a,272b are positioned on the rack return manifold. Cooling loop assembly 210 is joined to the first and second inlet connection points 270a,270b via first and second inlet connectors 242a,242b and first and second board supply lines 244a,244b. Additionally, cooling loop assembly 210 is joined to the first and second outlet connection points 272a,272b via first and second outlet connectors 242a,242b and first and second return lines 248a, 248b.

As in the previous example, one or more similar computing devices 220-1, 220-2, 220-3, 220-4 with similar cooling loop assemblies 210-1, 210-2, 210-3, 210-4 can be provided on additional shelves 260 of a computing device rack 262, all of which are coupled to the rack supply manifold 264 and a rack return manifold 266. A plurality of additional first and second inlet connectors 242c-j, as well as corresponding first and second board supply lines 244c-244j are joined to the rack supply manifold 264 at respective rack inlet connection points 270c-j. Additional first and second outlet connectors 272c-j and corresponding first and second return lines 248c-j are also joined to the rack outlet manifold 266 at respective rack outlet connection points 272c-j. In other examples, some of the computing devices may be connected to a separate set of rack supply and return manifolds.

Figure 6:
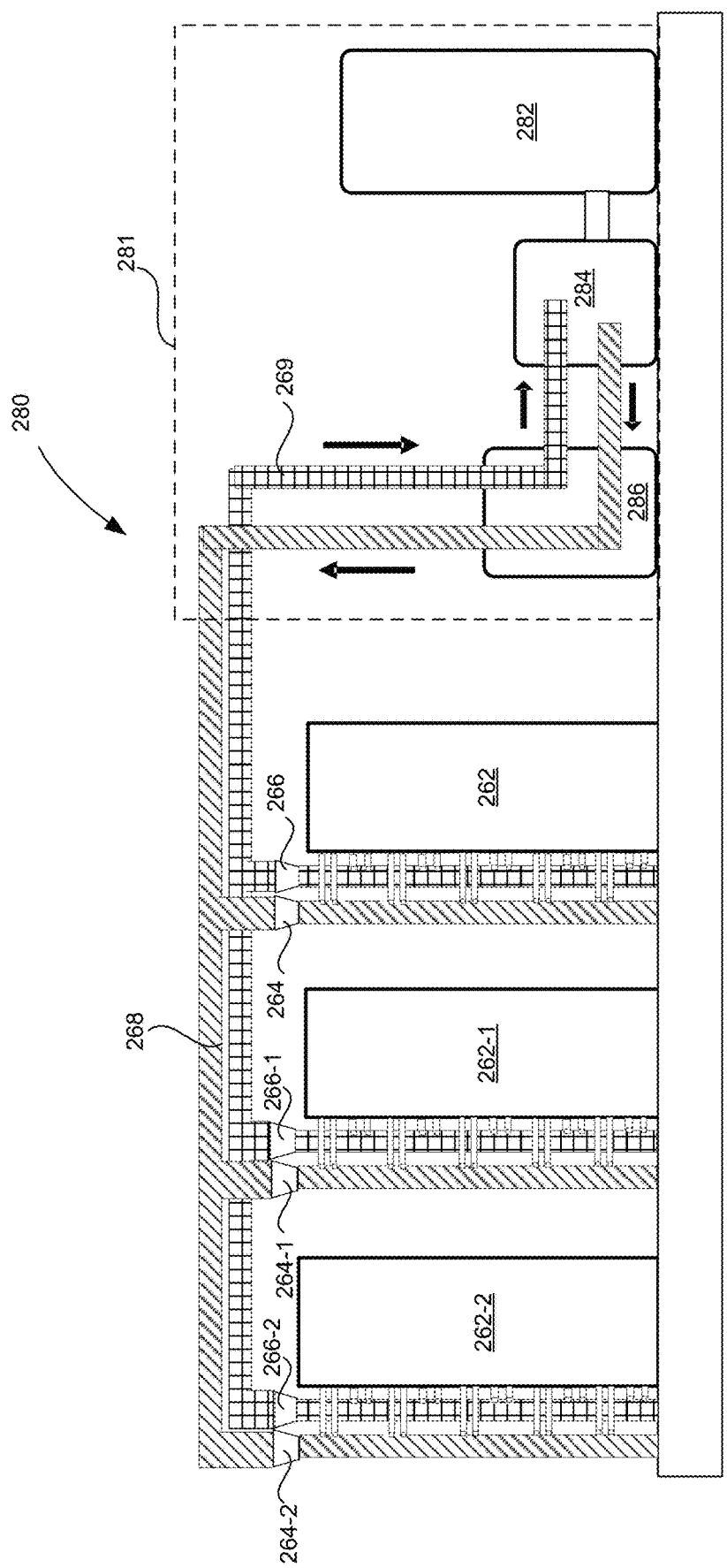
FIG. 6 is a schematic front view of an example cooling system that implements the computing device and cooling loop assembly of FIG. 5.

FIG. 6 illustrates a schematic cooling distribution system 280 that comprises a computing device rack 262, as well as any number of additional computing device racks, such as computing device racks 262-1,262-2, as well as a cooling and return sub-system 181. The cooling and return sub-system 181 can include a cooling liquid supply or storage tank 282, a chilling system 284, a central distribution unit 286, a central supply line 268 and central return line 269. The components of the central supply and return sub-system 281 can be identical to the previous example and is not discussed at length in this example, but other cooling and return sub-systems may be utilized herein. For ease of illustration, the components within the computing device racks are not shown. Each of the computing device racks 262,262-1,262-2 include rack supply manifolds 264,264-1, 264-2 and rack return manifolds 266, 266-1,266-2, positioned on the same side of the respective computing device racks 262,262-1,262-2. As in the previous example, cooling liquid can be distributed to each of the computing device racks 262,262-1,262-2 through a central supply line 268, which feeds into each of the rack supply manifolds 264, 264-1,264-2. As described in FIG. 5, cooling liquid can be distributed from the central supply line and rack supply manifolds into each of the computing devices through the first and second inlet connectors and board supply lines. Heated return cooling liquid can then travel through the return lines and outlet connectors and up through the rack return manifolds 266, 266-1,266-2 into the central return line 269. The heated cooling liquid can then be processed and cooled down in the components of the central supply and return sub-system 281 and recirculated through the system again.

Although the supply lines 244a,244b and return lines 248a,248b that extend to the rack supply manifold 264 and rack return manifold 266 are shown having example lengths, in other examples, the length of the supply and return lines can vary widely. This can allow for the cooling loop assembly 210 to be alternatively arranged on a computing device rack 160 in a similar configuration as the loop assembly 110 of FIGS. 2 and 3. For example, supply lines 244a,244b would extend to the rack supply manifold 164 of FIG. 2 on one side of the computing device rack 160, and return lines 246a,246b having a sufficient length to extend across the circuit board 220 can reach and be connected to the rack return manifold 166 of FIG. 2 positioned on a different side, including an opposite side of the computing device rack 162 of FIG. 2. The reverse is also true. Cooling loop assembly shown in FIG. 1, can also be configured and positioned on a computing device rack 260 of FIG. 5 relative to the directly adjacent rack supply manifold 264, and the rack return manifold 266.

The configurations shown in FIGS. 1-6 can be easily scalable and can allow for an increased number of supply and return lines. Such configurations can provide low pressure drop through the lines. Furthermore, such designs can provide for versatility in redundancy of the cooling loop designs, as will be discussed in more detail with regard to the example redundant systems described with regard to FIGS. 11-15.

Figure 7:
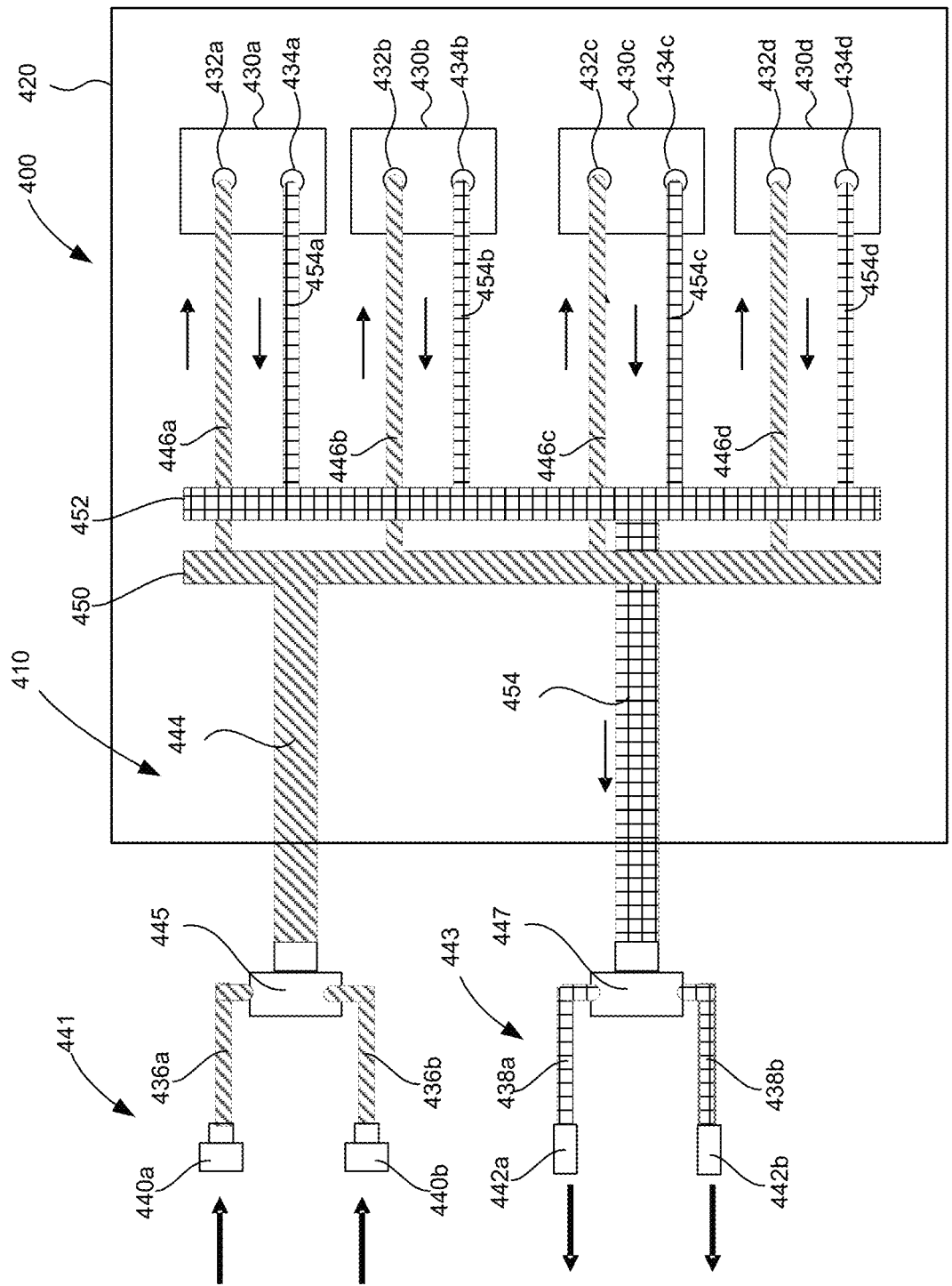
FIG. 7 is a schematic top view of an example system comprising a computing device and cooling loop assembly according to aspects of the disclosure.

FIG. 7 is another example system 400 that includes a cooling loop assembly 410 where the inlet configuration differs from the previous examples. In this example, an inlet tee 445 can be used to join a first inlet connector 440a and a second inlet connector 440b together so as to create a branched inlet connector or connection 441. As shown, the first connector inlet line 436a extends between the inlet tee 445 and the first inlet connector 440a. A second connector inlet line 436b extends between the inlet tee 445 and the second inlet connector 440b. The inlet tee 445 allows for distribution of combined cooling liquid flowing from the first inlet connector 440a and the second connector 440b to the board inlet manifold 450 through a board supply line 444. Use of a branched inlet connection 441 can help to avoid conflicts arising from the use of additional multiple inlet lines, as well as allow for increased space by eliminating extra lines. It can allow for retrofitting from existing single supply and return designs, and also provides a configuration that allows for versatility in creating a redundant system, such as in the examples discussed below regarding FIGS. 11-15.

An outlet tee connector 447 can be used to join a first outlet connector 442a and a second outlet connector 442b together so as to create a branched outlet connector or connection 443. As shown, the first connector outlet line 438a extends between the outlet tee connector 445 and the first outlet connector 442a. A second connector outlet line 438b extends between the outlet tee connector 445 and the second outlet connector 442b. The outlet tee connector 447 allows for the distribution of heated return cooling liquid flowing from the rack return manifold 452 through the return line 454 and into the outlet tee connector 447. At the outlet tee connector 447 the heated return cooling liquid can be divided between the first connector outlet line 438a and the second connector outlet line 438b.

During operation, cooling liquid will be pumped from a liquid source through the first and second connectors 440a, 440b and through the inlet tee 445 to the board supply line 444. The board supply line 444, which extends from the inlet tee 445 to the board inlet manifold 450, can further distribute the combined cooling liquid entering the cooling loop assembly 400 from the first inlet connector 440a and the second inlet connector 440b to the board manifold 450. Cooling liquid in the board manifold 450 will be further distributed to the inlets 432a, 432b, 432c, 432d of the cooling devices 430a, 430b, 430c, 430d through respective secondary inlet lines 446a, 446b, 446c, 446d.

Heated return cooling liquid exits the outlets 434a, 434b, 434c, 434d of each respective cooling device 430a, 430b, 4340c, 430d and flows to the board outlet manifold 452 through secondary outlet lines 454a, 454b, 454c, 454d. Heated return cooling liquid will then flow from board outlet manifold 452 to the outlet tee connector 447, where the flow will then be divided between the first and second connector lines 438a, 43b as the flow continues to the first and second outlet connectors 442a, 442b and to an outlet, such as a rack return manifold.

Figure 8:
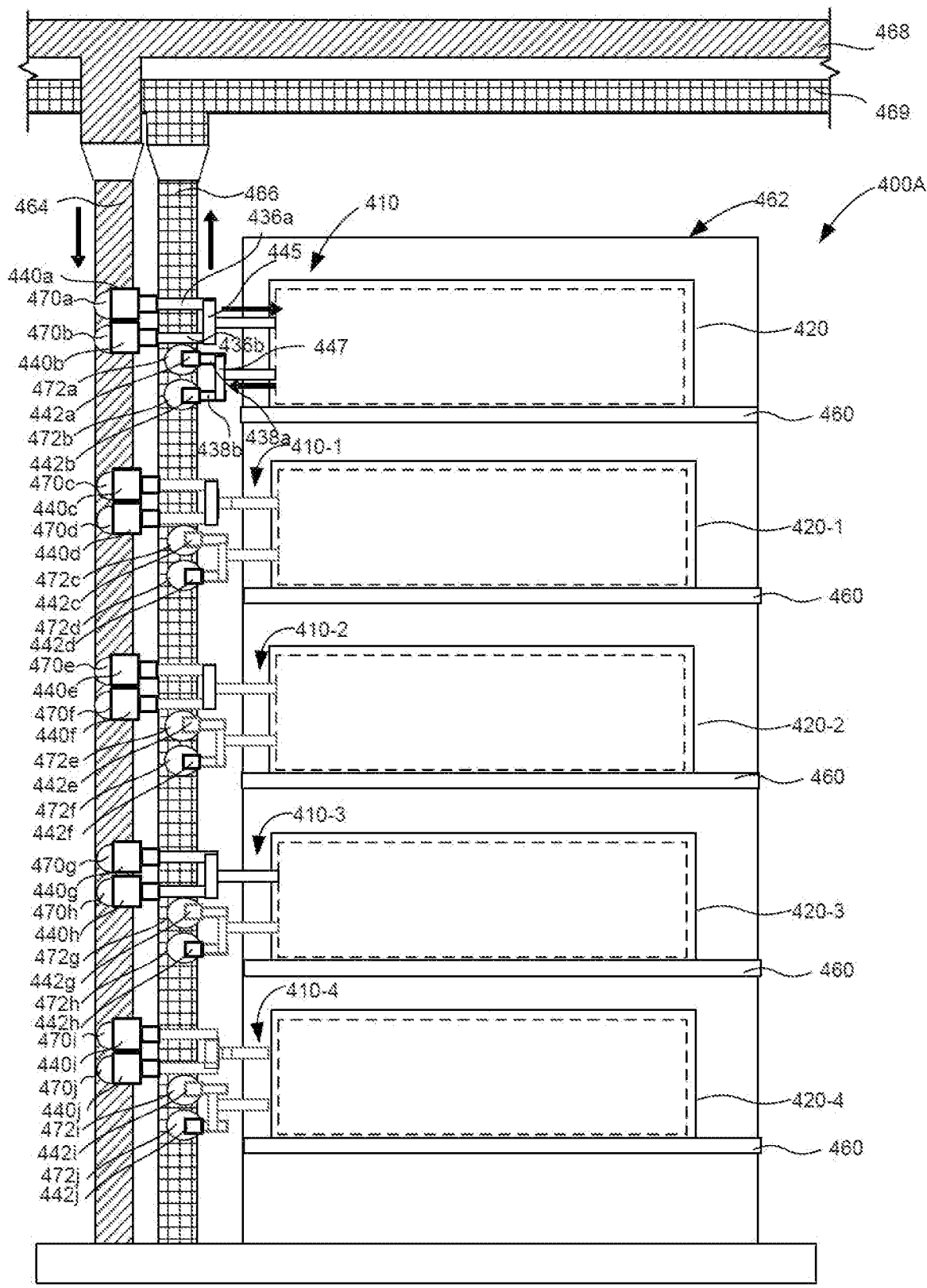
FIG. 8 is a schematic front view of an example system comprising the computing device and cooling loop assembly of FIG. 7 implemented within an example computing device rack, according to aspects of the disclosure.

FIG. 8 illustrates a schematic example of a rack system 400a that includes computing device 420 and cooling loop assembly 410 as part of a larger computing device rack 462, as well as branched inlets or dual inlet and dual outlet connection points to the cooling liquid source and liquid return outlet for each computing device 420-1, 420-2, 420-3, 420-4 on the respective shelves 460. The racks and computing devices are shown in one arrangement, but any arrangement may be utilized. As in the previous examples, rack supply manifold 464 may be connected with central supply line 468 and rack return manifold 466 can be connected to the central return line 469. With reference to the first shelf 460 and computing device 420, cooling liquid can enter the rack supply manifold 464 and be distributed through the first inlet connectors 440a at the first rack inlet connection point 470a and the second inlet connector 440b at the second rack inlet connection point 470b. The inlet tee 445 will combine the flow of cooling liquid through the first connector line 436a and the second connector line 436b and direct the flow through the board supply line 444. The flow will be distributed throughout the rest of the cooling loop assembly 410 as previously described and heated return cooling liquid will exit the computing device 420 through the board return line 454. The outlet tee 447 will then divide the volume of the heated return cooling liquid and direct the heated return cooling liquid through the first and second outlet lines 438a, 438b and outlet connectors 442a, 442b and into the rack return manifold 464 through the rack connection points 470a, 470b. The flow will then be distributed to the central outlet line 469.

Additional computing devices 420-1, 420-2, 420-3 can include a similar configuration. Cooling liquid will enter the rack supply manifold 464 and be further distributed through the first inlet connectors 440c, 440e, 440g, 440i at each respective first rack inlet connection point 470c, 470e, 470g, 470i, as well as through the second inlet connectors 440c, 440e, 440g, 440i at each respective second rack inlet connection point 470d, 470f, 470h, 470j. Heated return cooling liquid will exit each of the computing devices 420-1, 420-2, 420-3, 420-4 through the respective first outlet connectors 442c, 442e, 442g, 442i at each first rack outlet connection point 472c, 472e, 472g, 472i, as well as through the respective second outlet connectors 442d, 442f, 442h, 442j at each second rack outlet connection point 472d, 472f, 472h, 472j. In this example, each of the cooling loop assemblies 410-1, 410-2, 410-3, 4104 include a similar configuration as cooling loop assembly 410 where a tee is utilized to create branched inlets and outlets, but in other examples, any of the cooing loop assembly configurations may differ, including the number of inlets and outlets and the type of connections. The rack 462 can also be part of a larger system of racks, as previously described with regard to FIGS. 4 and 6.

In the example described, the first and second inlet connectors 440a, 440b are joined together by inlet tee 445, and the first and second outlet connectors 442a, 442b are joined together by an outlet tee connector 447. In other examples, one set of connectors may have a direct connection to a respective board manifold and the other set of connectors may include a tee connector and have an indirect connection to the respective board manifold. For example, the first and second inlet connectors 440a, 440b may be directly joined to the board inlet manifold 450, as described in any one of the foregoing examples, and the first and second outlet connectors 442a, 442b may be indirectly joined to the board outlet manifold through the outlet tee connector 447 and return line 454. Conversely, an opposite configuration is also possible in which the first and second inlet connectors 440a, 440b are joined together by the inlet tee 445 and indirectly connected to the board inlet manifold 450 through the board supply line 444, and the first and second outlet connectors 442a, 442b are directly connected to the board outlet manifold 452.

In the previous examples, a single cooling loop assembly is disclosed that includes an equal number of multiple inlet connection points to a single fluid inlet source and multiple outlet connection points to the fluid outlet source, when further distributing cooling liquid to and from the cooling devices through a board manifold. In other example configurations, including any of the configurations being described herein, the number of inlet connection points and outlet connection points can be optimized to achieve desired thermal and mechanical properties in the cooling loop assembly, as well as the overall system. For example, the number of inlet and outlet connection points does not need to be the same and fewer inlet and/or outlet connection points can be utilized in the cooling loop assembly.

Figure 9:
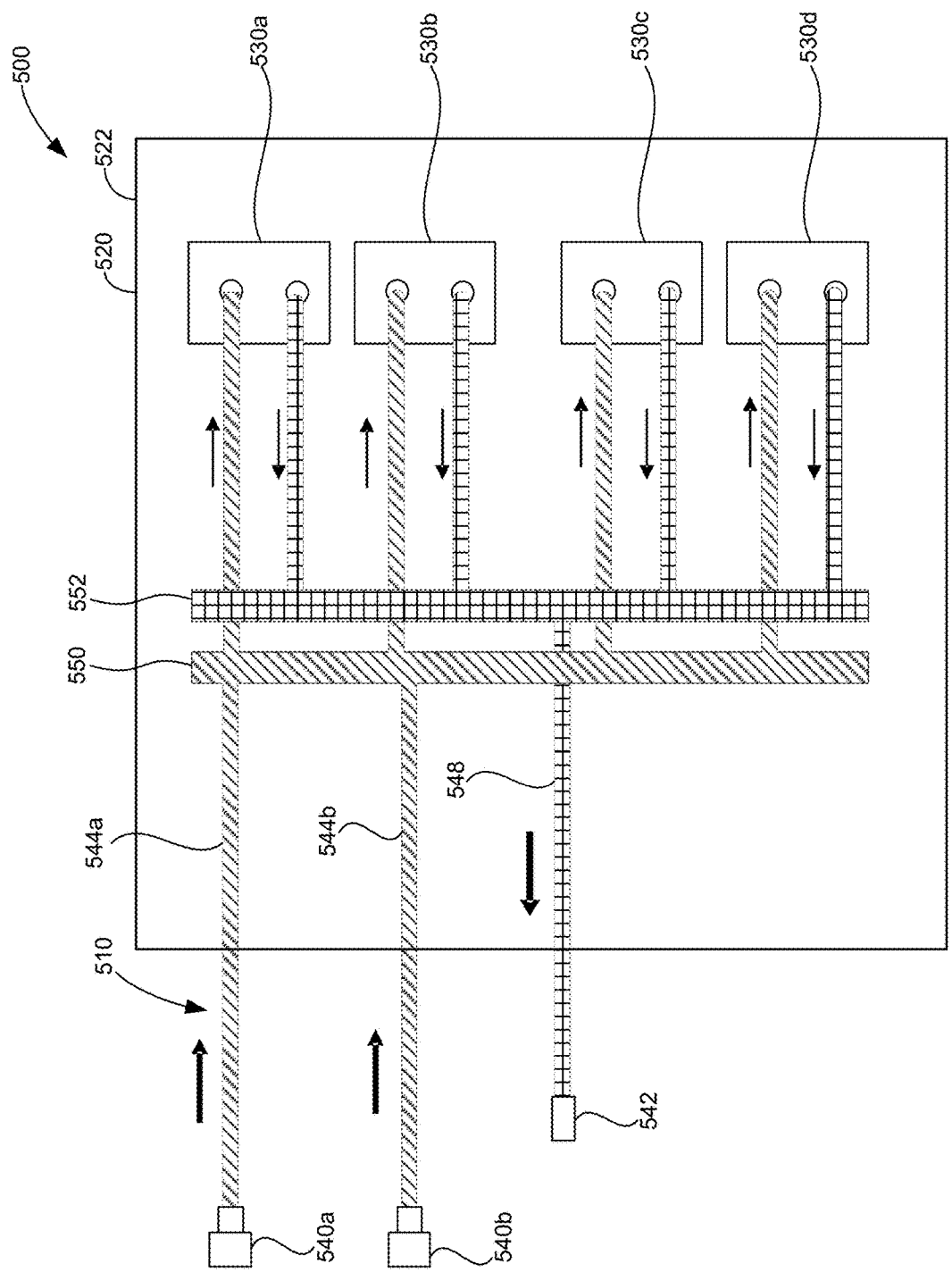
FIG. 9 is a schematic top view of an example system comprising a computing device and an example cooling loop assembly.

For example, with reference to FIG. 9, a cooling loop assembly 510 for thermal management of components and cooling devices 530a, 530b, 530c, 530d on a circuit board 520 of a computing device 522 is shown. The cooling loop assembly 510 is otherwise identical to the cooling loop 210 of FIG. 4, except that in this example, only one outlet connector 542 is present in the cooling loop assembly 510. As shown, cooling loop assembly 510 includes first and second inlet connectors 540a, 540b connected to a board inlet manifold 550, but only includes one outlet connector 542 that is connected to a board outlet manifold 550. As shown by the arrows in FIG. 9, the flow of cooling liquid through the board inlet manifold 550 and into each of the cooling devices 530a, 530b, 530c, 530d, as well as the flow of the heated return cooling liquid out of the cooling devices 530a, 530b, 530c, 530d and to the board outlet manifold 552 otherwise remains the same.

Figure 10:
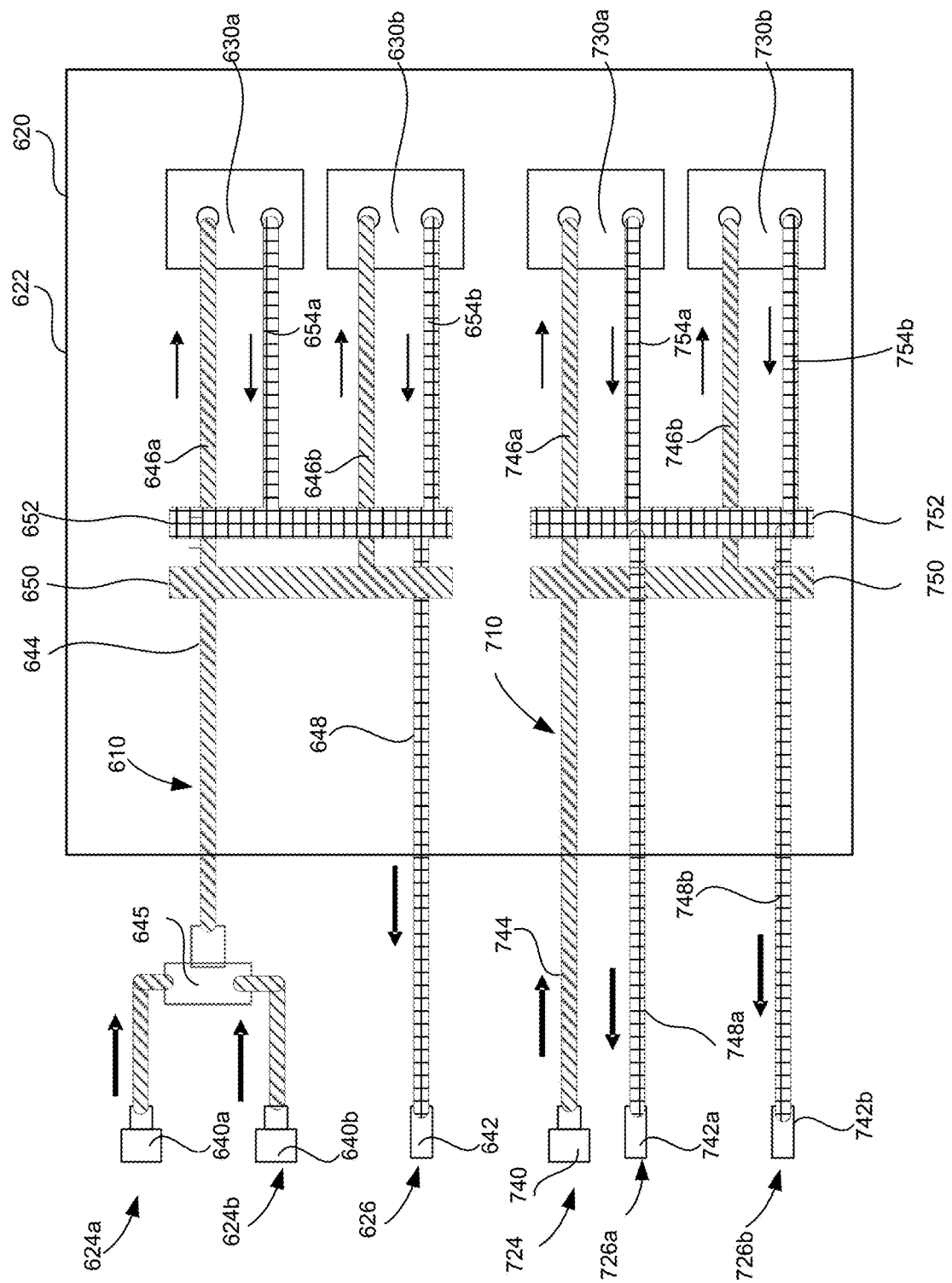
FIG. 10 is a schematic top view of an example system comprising a computing device and an example cooling loop assembly.

Multiple loop assemblies which include either or both multiple inlet connection points or multiple outlet connection points are also disclosed. FIG. 10 is one example of a circuit board 622 of a computing device 620 with a first cooling loop assembly 610A and a second cooling loop assembly 710.

The first cooling loop assembly 610 includes two inlets and one outlet. As shown, a branched inlet, as previously disclosed, includes a first inlet connector 640a and a second inlet connector 640b joined together by an inlet tee 645. A single board supply line 644 connects the tee connector 445 to a board inlet manifold 650, which is connected to the cooling devices 630a,630b along secondary inlet lines 646a. 646b. Secondary outlet lines 654a,654b extend from the cooling devices 630a,630b to the board outlet manifold 652, which in turn is connected to outlet connector 642 and outlet 626 by a single return line 648. As in the previous examples, cooling liquid can flow in the directions shown by the arrows.

The second cooling loop assembly 710 includes one inlet 724 having an inlet connector 740 and two outlets 726a, 726b with corresponding outlet connectors 726a,726b. Cooling liquid flows into supply line 744 through inlet 724 connector 740. Supply line 744 feeds into a board manifold 750, which is configured to distribute cooling liquid to cooling devices 730a,730b through secondary inlet lines 746a,746b. Heated return cooling liquid that exits cooling devices 730a,730b will flow through secondary outlet lines 754a,754b to the board outlet manifold 752. Return outlet lines 748,748b will distribute heated return cooling liquid from the board outlet manifold to outlet 726a,726b and connectors 742a,742b.

Any number of cooling devices may be implemented within a cooling loop assembly of a system. In any of the examples described herein, it may be desired to include a cooling loop assembly that has only one cooling device or at least one cooling device. In other examples, at least two, at least three, or at least five cooling devices can be used in the system according to aspects of the disclosure.

Figure 10A:
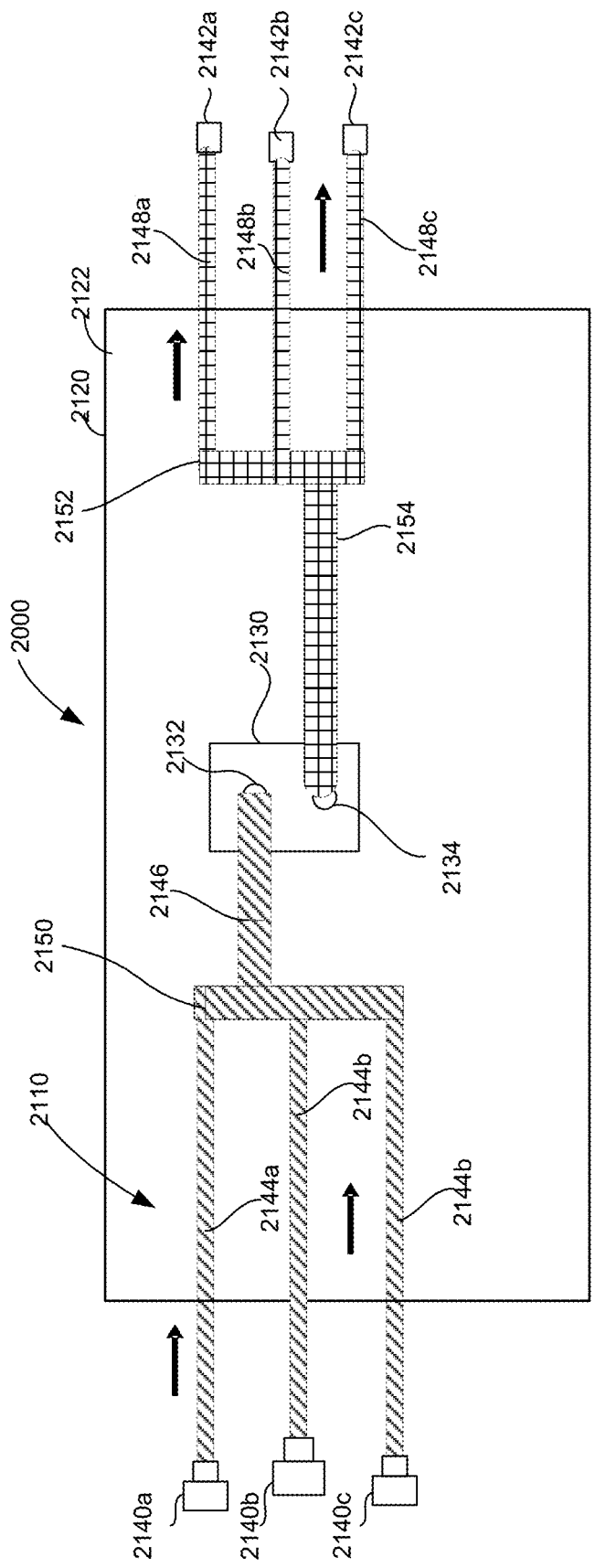
FIG. 10A is a schematic top view of an example system comprising a computing device and cooling loop assembly according to aspects of the disclosure.

FIG. 10A illustrates an example system 2000 that includes an example cooling loop assembly 2110 coupled to a single cooling device 2030 overlying a circuit board 2120 of a computing device 2120. At least three inlet connectors 2140a,2140b,2140c can be used to supply cooling liquid to the cooling device 2030, but in other examples greater or fewer inlet connectors may be used. In some examples, three inlet connectors 2140a,2140b,2140c can be coupled to a board inlet manifold 2150 by board supply lines 2144a, 2144b, 2144c, but in other examples greater or fewer outlet connectors may be used. At least three outlet connectors 2142a,2142b,2142c are coupled to the cooling device 2130. In this example, board return lines 2148a,2148b,2148c can directly connect the outlet connectors 2142a,2142b,2142c to the board return manifold 2152, and a secondary return line 2154 couples the board return manifold 2152 to the outlet 2134 of cooling device 2130. Similarly, board supply lines 2144a,2144b,2142c can directly connect the inlet connectors 2140a,2140b,2140c to the board inlet manifold 2150, and a secondary supply line 2146 couples the board supply manifold 2150 to the inlet 2132 of the cooling device 2130. When the supply and return lines are oriented in this configuration, the outlet connectors 2142a,2142b,2142c can directly connect to a rack return manifold (not shown) oriented on one side of the cooling device 2130, and the inlet connectors 2140a,2140b,2140c can connect directly connect to a rack supply manifold (not shown) oriented on the opposite side of the cooling device 2130. In some examples, the rack supply and rack return manifolds may be oriented as shown in FIG. 2.

Figure 10B:
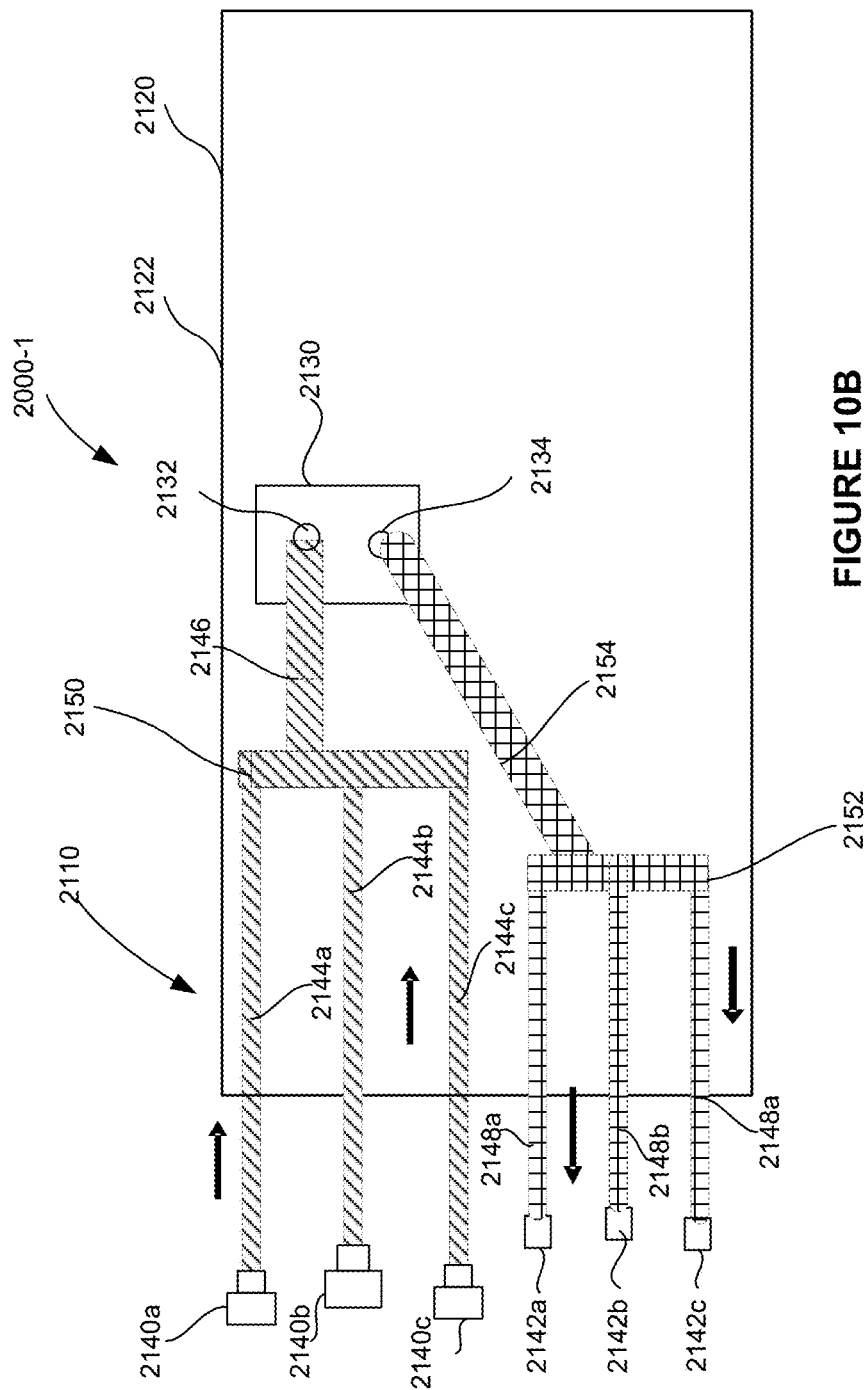
FIG. 10B is a schematic top view of an example system comprising a computing device and cooling loop assembly according to aspects of the disclosure.

FIG. 10B shows an alternative system 2000-1 in which inlet connectors 2140a,2140b,2140c and outlet connectors 2142a,2142b,2142c are coupled to cooling device 2130 in a different configuration. The lines can instead be oriented so that the outlet connectors 2142a,2142b,2142c and inlet connectors 2140a,2140b,2140c, the corresponding supply lines 2144a, 2144b, 2144c, 2146 and return lines 2138a, 2148b,2148c, 2154, and the board inlet manifold 2150 and board return manifold 2152 can be joined to a rack return manifold (not shown) and a rack supply manifold (not shown) oriented on the same side of the cooling device 2130, which is also oriented on the same side of the circuit board 2122. For example, the inlet connectors 2140a,2140b, 2140c and outlet connectors 2142a,2142b,2142c can join to the rack supply manifold 264 and rack return manifold 266 shown in FIG. 5.

Figure 10C:
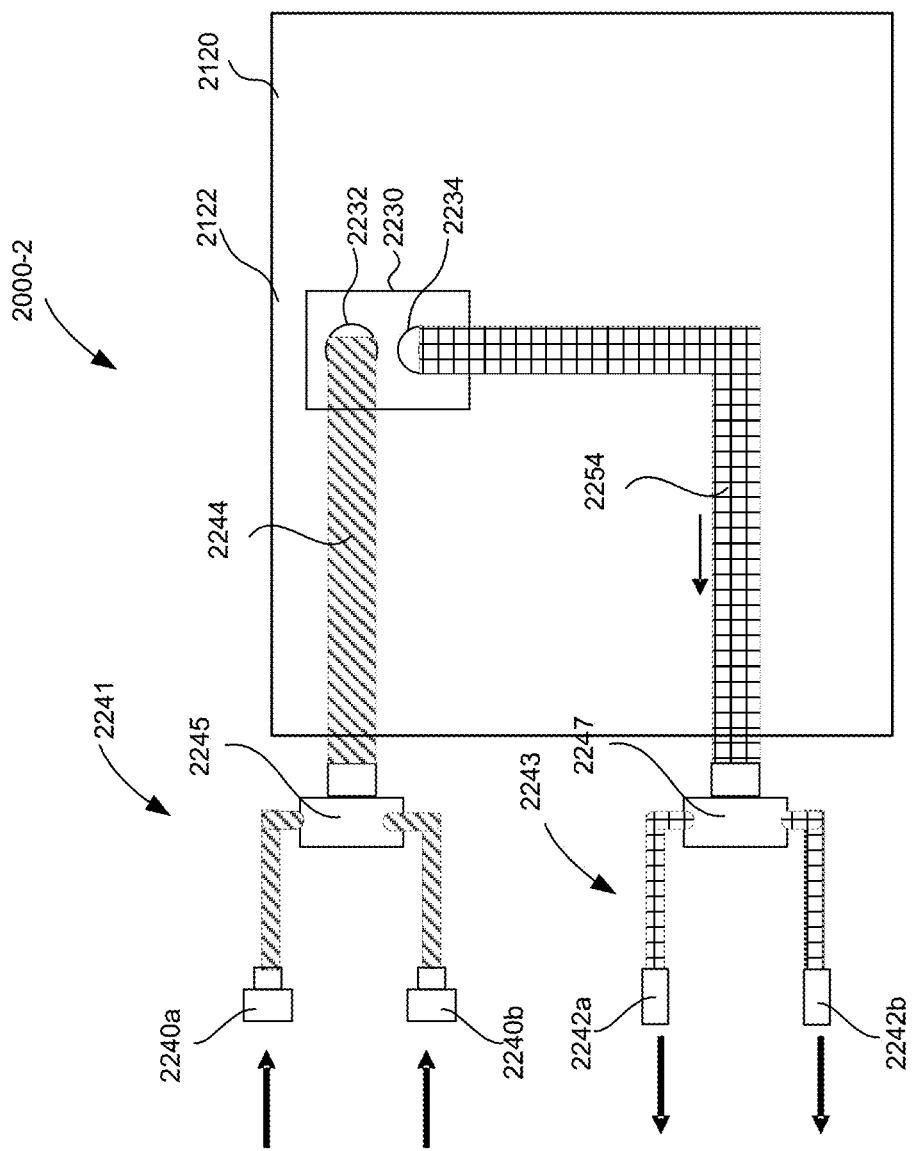
FIG. 10C is a schematic top view of an example system comprising a computing device and cooling loop assembly according to aspects of the disclosure.

FIG. 10C shows another example system 2000-2 with a branched inlet connector or connection 2241 and a branched outlet connector or connection 2243. The branched inlet and outlet connections can be identical to the example disclosed in FIG. 7 and are not described in detail. In this configuration, both the inlet connectors 2240a,2240b,2240c and outlet connectors 2242a,2242b,2242c are positioned on one side or the same side of the cooling device 2230. Since only one cooling device 2130 is provided on the system, a board supply line 2244 can directly connect the branched inlet connector 2241, including inlet connectors 2240a,2240b and the inlet tee 2145, to the inlet 2232 of the cooling device 2230. Similarly, a board return line and a board return line 2254 can couple or directly connect the branched outlet connectors 2243, including outlet connectors 2242a,2242b and outlet tee 2247, to the outlet 2234 of the cooling device 2230. This can allow for connection to a rack supply manifold and a rack return manifold positioned on the same side of the cooling device, as in prior examples. Alternatively, either one of the inlet connectors and outlet connectors may be positioned on an opposite side of the cooling device 2230. This can allow for connection to a rack supply manifold and a rack return manifold positioned on opposite sides of the cooling device, as in prior examples.

Figure 11:
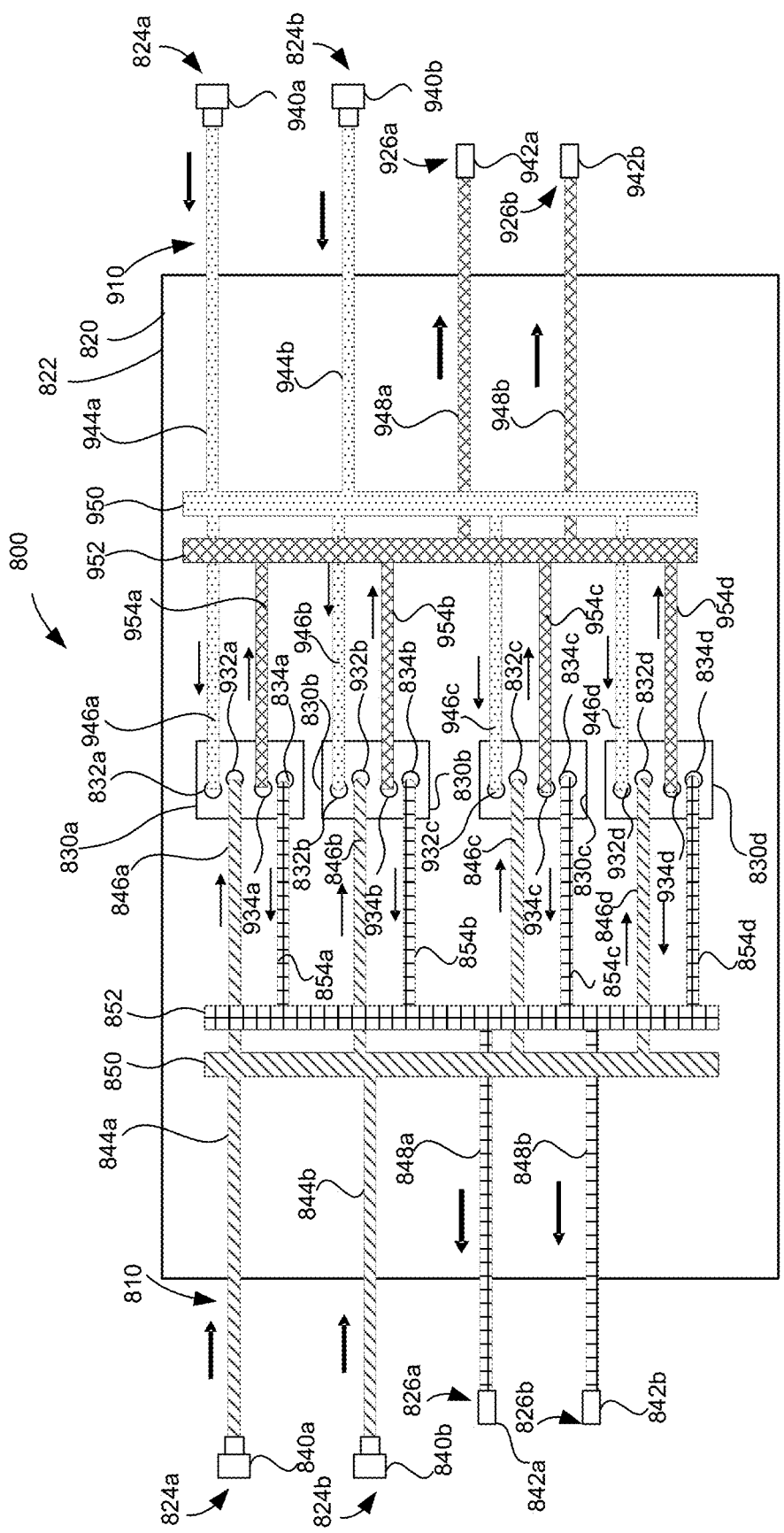
FIG. 11 is a schematic example of a top view of a computing device with two cooling loop assemblies according to aspects of the disclosure.

The use of multiple inlets and outlets, as well as multiple loop assemblies on a single circuit board can be used to create redundancy in the overall cooling system, while reducing the pressure drop at the inlet and outlet couplings/ connectors. FIG. 11 illustrates an example system 800 that includes a circuit board 822 of a computing device 820, cooling devices 830a,830b,830c,830d, and two cooling loop assemblies, a first cooling loop assembly 810 and a second cooling loop 910. In this configuration, each of the first and second loop assemblies 810,910 has an independent assembly source inlet manifold and an assembly outlet manifold. Both the first and second cooling loop assemblies 810, 910 can feed cooling liquid into and out of the same cooling devices 830a,830b,830c,830d. As will be described in more detail below, in the event one or a portion of the first and/or second cooling loops 810,910 malfunctions, the other cooling loop, which has a separate liquid source, remains in operation, thereby allowing for redundancy of the system.

In this example, the two cooling loop assembles are disposed on opposed sides of the cooling devices 830a,830b, 830c,830d, but the cooling loops can remain in fluid communication in any configuration relative to the cooling devices 830a,830b,830c,830d. First cooling loop assembly 810 is positioned on the left side of the circuit board 822, whereas the second cooling loop assembly 910 is positioned on the right side of the circuit board 822. The first cooling loop assembly 810 is similar to the cooling loop assembly 110 previously described with regards to FIG. 4. Similar reference numerals will be used to identify similar components and a full discussion is not repeated here. The inlets 826a,826b, including first and second inlet connectors 840a, 840b of the first cooling loop assembly 810 can be connected to a first cooling liquid supply source that is external to the circuit board, such as a rack supply manifold (not shown) via first and second connectors 840a,840b. The outlets 826a, 826b, including first and second outlet connectors 842a, 842b are similarly connected to an outlet external to the circuit board 822, such as rack return manifold (not shown).

Figure 12:
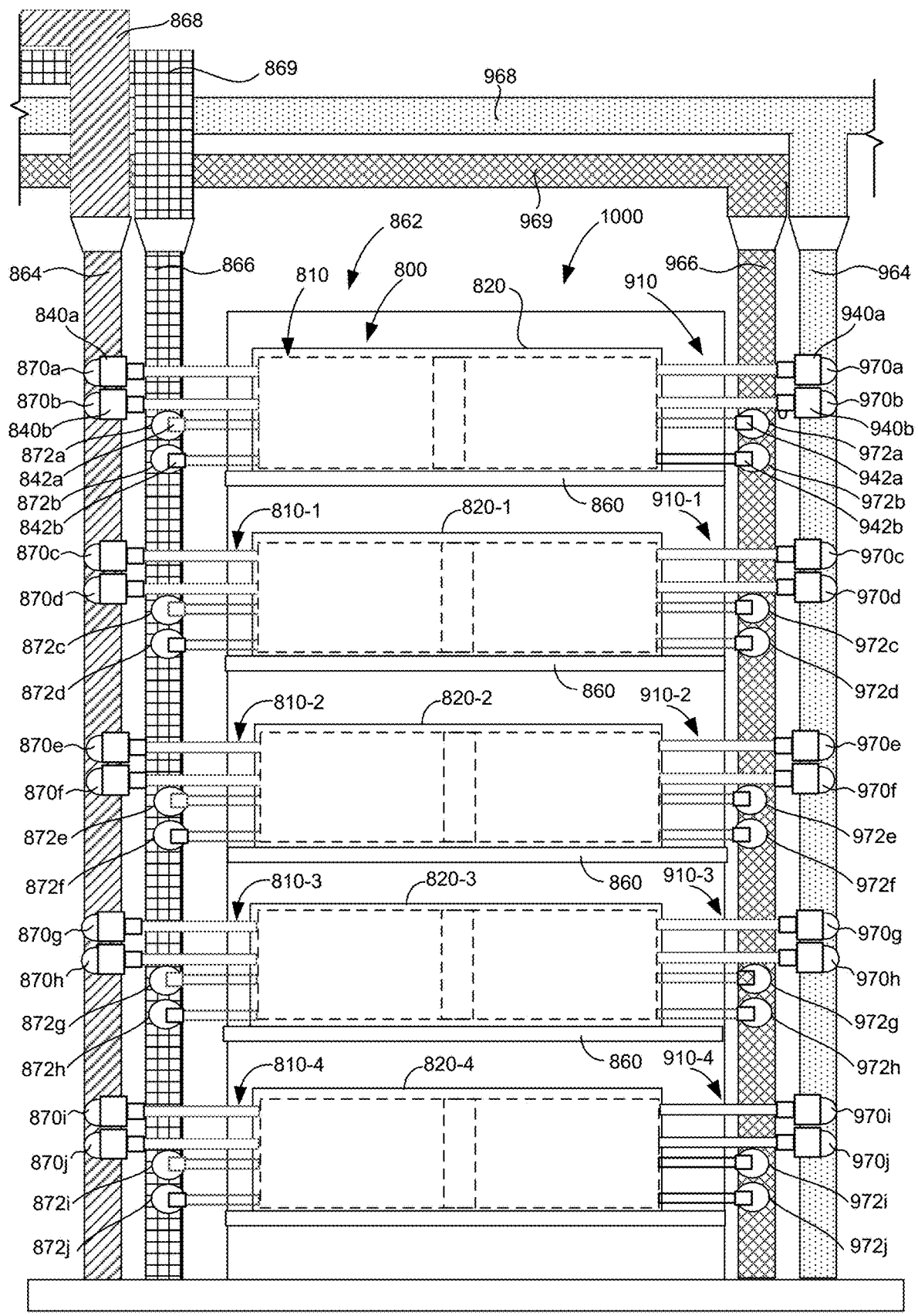
FIG. 12 is a schematic top view of an example system comprising the computing device and cooling loop assembly of FIG. 11 implemented within an example computing device rack, according to aspects of the disclosure.

Second cooling loop assembly 910 is a redundant cooling loop assembly that is a mirror image of first cooling loop assembly 810 and operates in a similar way and where similar reference numerals will be used to identify similar features. Cooling liquid flowing toward cooling devices 830a,830b,830c and in the inflow direction are illustrated with a dotted pattern. The outlets 824a,825 of the second cooling loop assembly 910, including first and second outlet connectors 940a,940b, are connected to a redundant and second cooling liquid supply source that is external to the circuit board, such as a rack supply manifold 964 (FIG. 12). The outlets 926a,926b are connected to a second assembly outlet, such as rack return manifold 966 (FIG. 12). Heated return cooling liquid flowing away from cooling devices 830a,830b,830c and in the outflow direction are illustrated with a diamond pattern.

Each of the cooling devices 830a,830b,830c,830d include dual inlets and outlets, although in other examples the devices include only a single inlet and a single outlet. As shown, cooling devices 830a,830b,830c,830d have first cooling device inlets 832a,832b,832c,832d and respective second cooling device inlets 932a,932b,932c,932d, as well as respective first cooling device outlets 834a,834b,834c, 834d and respective second cooling device outlets 934a, 934b,934c,934d. In this configuration, the first cooling device inlets 832a,832b,832c,832d are respectively connected to secondary supply lines 846a,846b,846c,846d of the first cooling loop assembly 810. The second cooling device inlets 932a,932b,932c,932d are respectively connected to secondary supply lines 846a,846b,846c,846d of the second cooling loop assembly 910. Similarly, first cooling device outlets 834a,834,834c,834d are connected to respective secondary return lines 854a,854b,854c,854d of the first cooling loop assembly 810. Second cooling device outlets 934a,934b,934c,934d are respectively connected to secondary return lines of the second cooling loop assembly 910.

During operation, cooling liquid flows into the first inlets 832a,832b,832c,832d and second inlets 932a,932b,932c, 932d of the respective cooling devices 830a,830b,830c,830d from cooling liquid supplied by both the first cooling loop 810 and the second cooling loop 910. Cooling liquid will flow through the first and second inlet connectors 840a,840b of the first loop assembly 810 to the respective cooling devices 830a,830b,830c,830d. In one example, cooling liquid will flow through the first and second board supply lines 844a,844b, to the board supply manifold 850, and through respective secondary supply lines 846a,846b,846c,846d to respective first inlets 832a,832b,832c,832d of the respective cooling devices 830a,830b,830c,830d. Similarly, a second source of cooling liquid will flow through the first and second inlet connectors 940a,940b of the second loop assembly 910 to the respective second inlets 932a,932b, 932c,932d of the respective cooling devices 830a,830b, 830c,830d. In one example, cooling liquid will flow through the first and second board supply lines 944a,944b, to the board supply manifold 950, and through respective secondary supply lines 946a,946b,946c,946d to respective second inlets 932a,932b,932c,932d.

Cooling liquid within each of the cooling devices 830a, 830b,830c,830d will then exit from the respective cooling device through first outlets 834a,834b,834c,834d and second outlets 934a,94b,934c,934d. In one example, cooling liquid from the first outlets 834a,834b,834c,834d will flow through secondary supply lines 854a,854b,854c,854d of the first cooling liquid assembly to the board return manifold 852, as well as through primary return lines 848a,848b and to the outlets 826a,826b through outlet connectors 826a, 826b. Cooling liquid from the second outlets 934a,934b, 934c,934d of the second loop assembly 910 will also direct flow to the outlet connectors 842a,842b. In one example, heated cooling liquid will flow from the respective second outlets 934a,934b,934c,934d through secondary supply lines 954a,954b,954c,954d of the second cooling assembly 910 to the board return manifold 952, as well as through primary return lines 948a,948b and through outlet connectors 926a,926b of the second loop assembly.

Turning to FIG. 12, a rack assembly 1000, which includes circuit board 822 of computing device 820 and first and second cold plate loop assemblies 810,910, is shown positioned on a top shelf 860 of a larger data rack 862, and cooling system. Additional computing devices 820-1,820-2, 820-3,820-4 are positioned on additional shelves 860 within the rack 862. First cooling liquid assemblies 810-1,810,2, 810-3,810-4 and the redundant second cooling liquid assemblies 910-1,910-2,910-3,91-4 are shown extending into each of the respective computing devices 820-1,820-2,820-3,820-4.

For ease of illustration, the components within the computing device 820 are not illustrated in detail and instead portions of the first cold loop assembly 810 and the second cold loop assembly 910 that are positioned within computing device 820 are represented by a broken line rectangle. Since the first and second cold loop assemblies 810,916 overlap along the inlets and outlets of the cooling devices (FIG. 11), the broken line rectangles are shown overlapping.

Figure 13:
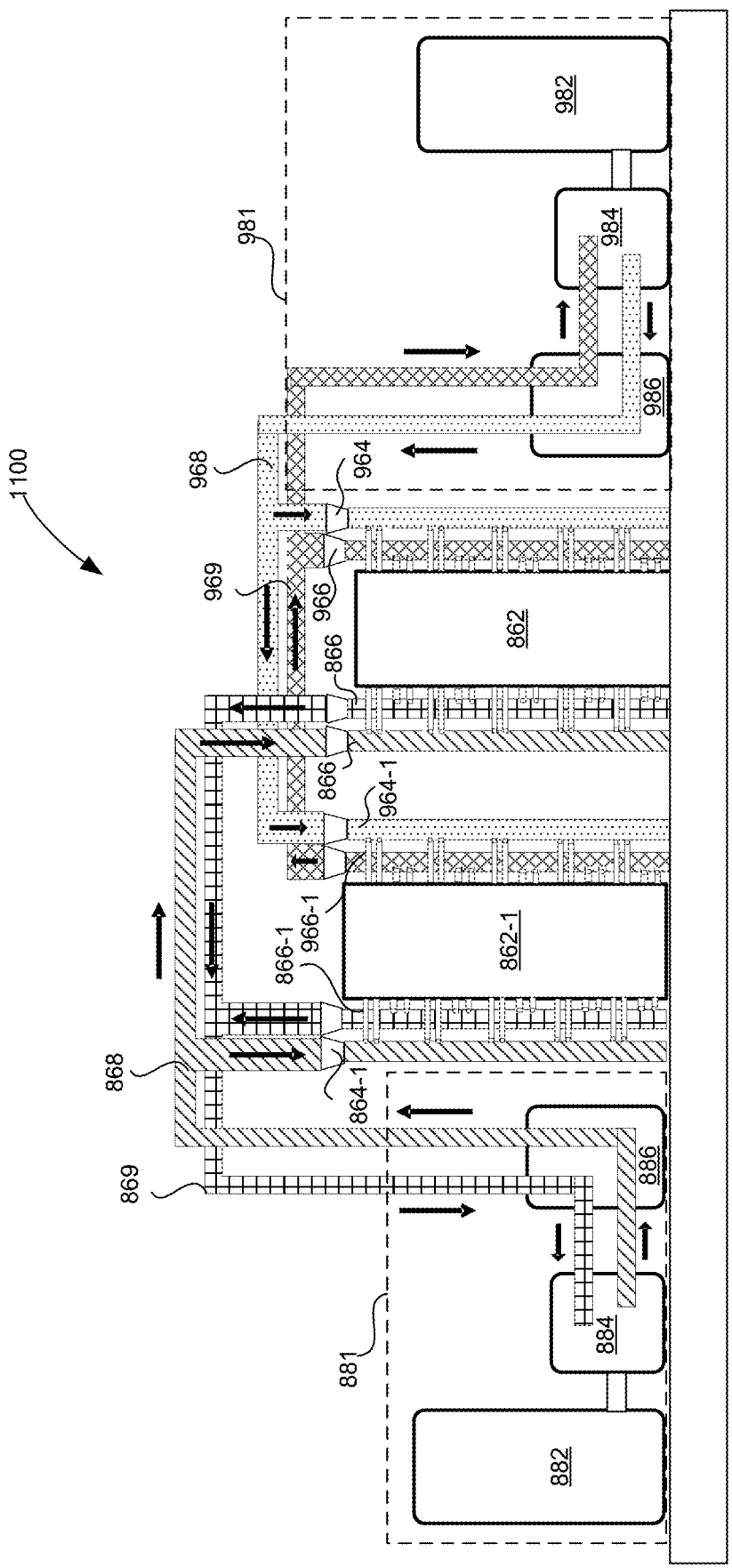
FIG. 13 is a schematic front view of a cooling system comprising the computing device and cooling loop assembly of FIG. 4.

The rack assembly 1000 includes a first rack supply manifold 864 and a second rack supply manifold 964 that supplies cooling liquid to all computing devices 820,820-1, 820-2,820-3,820-4 on the rack with supply lines attached to the respective first rack supply manifold 864 and second rack supply manifold. Similarly, a first rack return manifold 866 and a second rack return manifold 966 provide an outlet for heated return cooling liquid exiting the respective computing devices 820,820-1,820-2,820-3,820-4 through supply lines attached to the first rack return manifold and second rack return manifold 966. A first central supply line 868 feeds cooling liquid into the first rack supply manifold 864 and first central return line 869 distributes return cooling liquid back to the cooling central supply and return subsystem 881 (FIG. 13). A second central supply line 968 feeds cooling liquid into the second rack supply manifold 964 and first central return line 969 distributes heated return cooling liquid from the second manifold 966 to the central supply and return subsystem 981 (FIG. 13).

The first rack supply manifold 864 includes a plurality of inlets or openings along its length, including first rack inlet connection points 870a, 870c,870e,870g,870i and plurality of second rack inlet connection points 870b,870d,870f,870h, 870j. The first rack return manifold 866 similarly includes a plurality of openings along its length, including first rack outlet connection points 872a, 872c,872e,872g,872i and a second rack outlet connection points 872b,872d, 872f, 872h, 872j.

The second rack supply manifold 964 and return manifold 966 are redundant manifolds that provide a secondary or redundant source of cooling liquid for each computing device on the shelves 860, and allow for distribution of heated return cooling liquid from a separate cooling liquid source, as discussed in more detail in FIG. 13. The second rack supply manifold 864 includes a plurality of inlets or openings along its length to allow for connection of supply lines to the manifold, including first rack inlet connection points 970a, 970c, 970e,970g,970i and plurality of second rack inlet connection points 970b,970d,970f,970h,970j. The first rack return manifold 966 similarly includes a plurality of openings along its length to allow for connection of return lines to the manifold, including first rack outlet connection points 972a, 972c, 972e,972g,972i and a second rack outlet connection points 972b,972d,972f,972h,972j.

With reference to the first computing device 820 in the assembly 1000, at one end of the computing device 820 the first cooling loop assembly 810 is connected to the first rack supply manifold 864 and rack return manifold 866. The first inlet connector 840a of the first cooling loop assembly 810 is joined to the first connection points 870a on the first rack supply manifold 864 and the second inlet connector 840b of the first cooling loop assembly 810 is connected to the second connection point 870b. This provides for fluid communication between the first rack supply manifold 864 and the first cooling loop assembly 810. Similarly, the first outlet connector 842a is connected to the first outlet connection point 872a and second outlet connector 842b is connected to the second outlet connection point 872b on the first rack return manifold 866. This allows for fluid communication between the first rack return manifold 864 and the first cooling loop assembly 810.

At the other end of the computing device 820 the second cooling loop assembly 910 is connected to the second rack supply manifold 964 and second rack return manifold 966. The second rack supply manifold 964 provides a redundant cooling liquid supply to the second cooling loop assembly 910. As shown, the first inlet connector 940a of the second cooling loop assembly 910 is joined to the first connection points 970a on the second rack supply manifold 964 and the second inlet connector 940b of the second cooling loop assembly 910 is connected to the second connection point 970b. This provides for fluid communication between the redundant and second rack supply manifold 964 and the second cooling loop assembly 910. Similarly, the first outlet connector 942a is connected to the first outlet connection point 972a and second outlet connector 942b is connected to the second outlet connection point 972b on the second rack return manifold 966. This allows for fluid communication between the second rack return manifold 864 and the second cooling loop assembly 910.

Each of the remaining computing device 820-1,820-2, 820-3,820-4 includes respective first cooling loop assemblies 810-1,810-2,810-3,810-4 and redundant and second cooling loop assemblies 910-1,910-2,910-3,910-4 that include similar structure and operate in a manner identical to computing device 820. For example, each of the first cooling loop assemblies 810-1,810-2,810-3,810-4 are connected to the first rack supply manifold 864 and the first rack return manifold 866 as described with regard to the first cooling loop 810 and are not further described in detail. Second cooling loops assemblies 910-1,910-2,910-3,910-4 are also similarly attached to the second rack supply manifold 964 and second return manifold 966 as described with regard to the second cooling loop 810 and are not further described in detail. In other examples, the cooling loop assemblies used in the system may vary.

With reference to FIG. 13 a schematic redundant cooling distribution system 1100 is shown that comprises computing data rack 862, as well as at least one additional computing device rack 862-1. In other examples, any number of computing device racks may be utilized in the system. The redundant system 1100 includes a first central supply and return subsystem 881 and a redundant and second central supply and return subsystem 981. The first subsystem 881 provides for circulation of cooling liquid into each of the computing device racks 862,862-1 and out of the computing device racks 862,862-1. As shown, the subsystem 881 supplies cooling liquid to the first rack supply manifolds 864,864-1 and the first cooling loop assemblies and returns the heated return cooling liquid from the second cooling loop assemblies through the first rack return manifolds 866,866-1. The first supply and first return manifolds are shown positioned on the left side of the computing device racks 862,862-1. This second subsystem provides a redundant supply of cooling liquid through the redundant and second supply manifolds 964,964-1 to the second cooling loop assemblies of the computing device racks 862,862-1. Similarly, heated return cooling liquid exiting the second cooling loop assemblies of the computing devices in the respective racks 862,862-1 flow through the second return manifolds 966, 966-1. The components of the second subsystem 981 may be independent of the first subsystem 881 to the extent that it includes its own set of system components and operates on a loop that is independent of the loop in the first subsystem 881. With separate cooling liquid supplies in the system and separate returns, this system ensures that even if one of the components in the first subsystem 881 fails, such as the central distribution unit 886, the redundant supply and return provided by the second subsystem 981 will ensure that the components within the computing devices are continually cooled. In a scenario where the central distribution unit 886 fails, the computing devices within the computing devices racks 862,862-1 would overheat without the presence of the subsystem 981. In other examples, one or more components of the first and second subsystems 881,981 may be shared.

The operation of the first central supply and return subsystem 881 is identical to the examples previously described. A water source 882 may pump a cooling liquid, such as water, into cooling unit 884. Cooling unit 884 can be any conventional cooling unit 184 capable of cooling water within the unit to a pre-set temperature. Water from cooling unit 884 will then be pumped into the central distribution unit 886, which will further pump and distribute cooling liquid through the central cooling liquid inlet line 868 and into each of the first rack supply manifolds 964, 864-1 and into each of the first and second connectors (not shown) of each computing device (not shown) in the respective computing device racks 862, 862-1. Heated return cooling liquid will exit the respective computing device racks 862, 862-1 through the respective first rack return manifolds 866, 866-1 and into the central cooling liquid outlet line 869 and back to the central distribution unit 886. The CDU will then pump the heated return cooling liquid into the cooling unit 884 where the heated return cooling liquid will be cooled and then circulated back into the central distribution unit 886 and pumped back into the system. It is to be appreciated that the central supply and return sub-system 881 provides one method and components for providing, cooling, and distributing the cooling liquid into the central inlet and outlet lines, and numerous other examples may be used to accomplish the same function. For example, the lines may run underground, additional or fewer cooling components may be used.

The operation of the second central supply and return subsystem 881 is identical to the examples previously described. A water source 982 may pump a cooling liquid, such as water, into cooling unit 984. Cooling unit 984 can be any conventional cooling unit 984 capable of cooling water within the unit to a pre-set temperature. Water from cooling unit 984 will then be pumped into the central distribution unit 986, which will further pump and distribute cooling liquid through the central cooling liquid inlet line 968 and into each of the first rack supply manifolds 964, 964-1 and into each of the first and second connectors (not shown) of each computing device (not shown) in the respective computing device racks 962, 962-1. Heated return cooling liquid will exit the respective computing device racks 962, 962-1 through the respective first rack return manifolds 966, 966-1 and into the central cooling liquid outlet line 969 and back to the central distribution unit 986. The CDU will then pump the heated return cooling liquid into the cooling unit 984 where the heated return cooling liquid will be cooled and then circulated back into the central distribution unit 986 and pumped back into the system. It is to be appreciated that the central supply and return sub-system 981 provides one method and components for providing, cooling, and distributing the cooling liquid into the central inlet and outlet lines, and numerous other examples may be used to accomplish the same function. For example, the lines may run underground, additional or fewer cooling components may be used.

While the first and second subsystems 810,910 are identical in this example, they may differ in other examples or applications.

Figure 14:
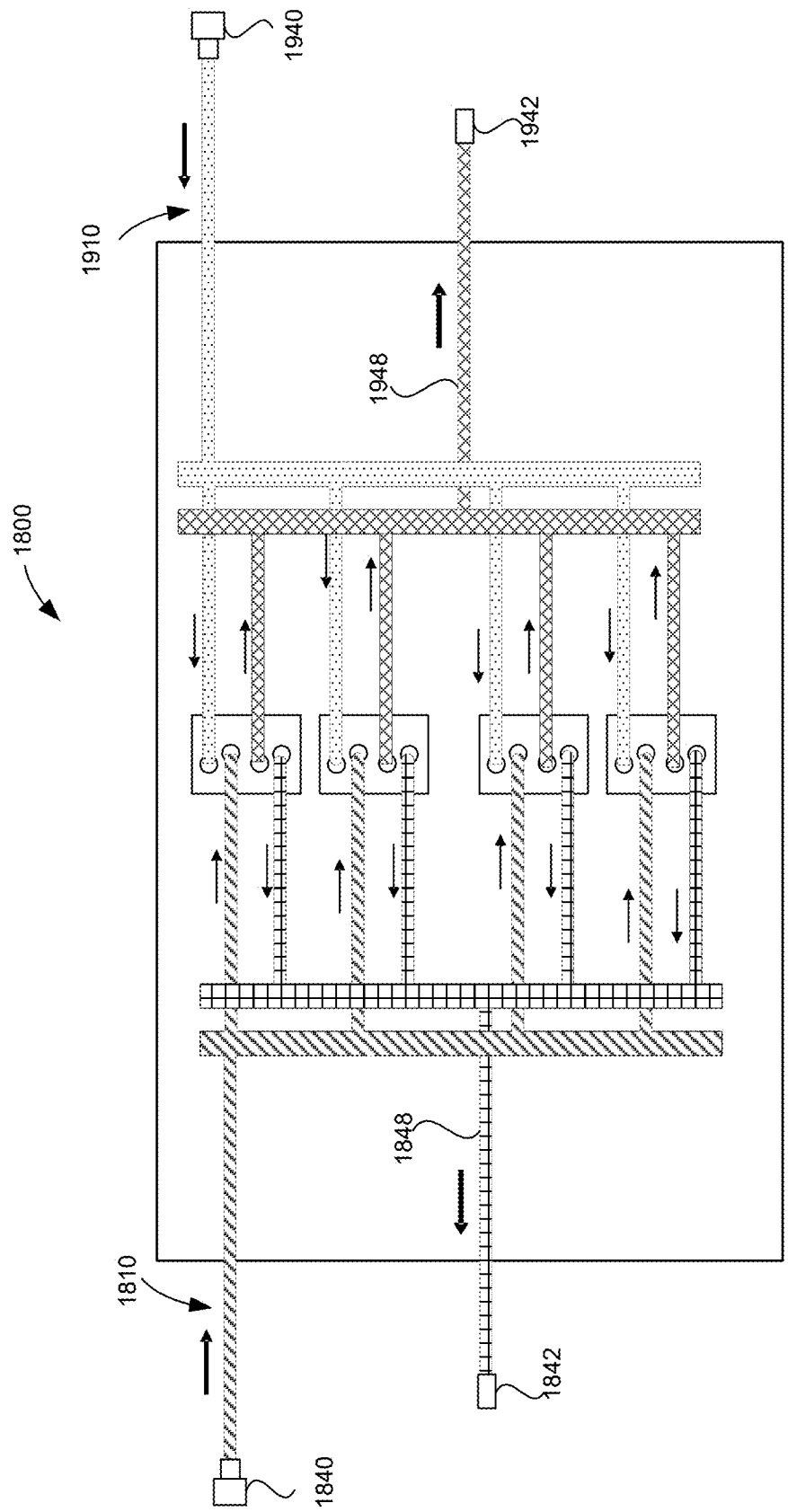
FIG. 14 is a schematic top view of an example computing device with two cooling loop assemblies according to aspects of the disclosure.

FIG. 14 is an assembly 1800 that is a variation of the assembly 800 shown in FIGS. 11-13. The only difference between the two assemblies is that in the present assembly 1800, the first cooling loop assembly 1810 only includes one inlet connector 1840 and one outlet connector 1842. Similarly, the second cooling loop assembly 1910 only includes one inlet connector 1940 and one outlet connector 1942. Otherwise, the assembly 1800 is identical to assembly 800, such that the first and second cooling loop assemblies 1810,1910 are identical to the assemblies of FIGS. 11-13 and operate in the same manner.

Figure 15:
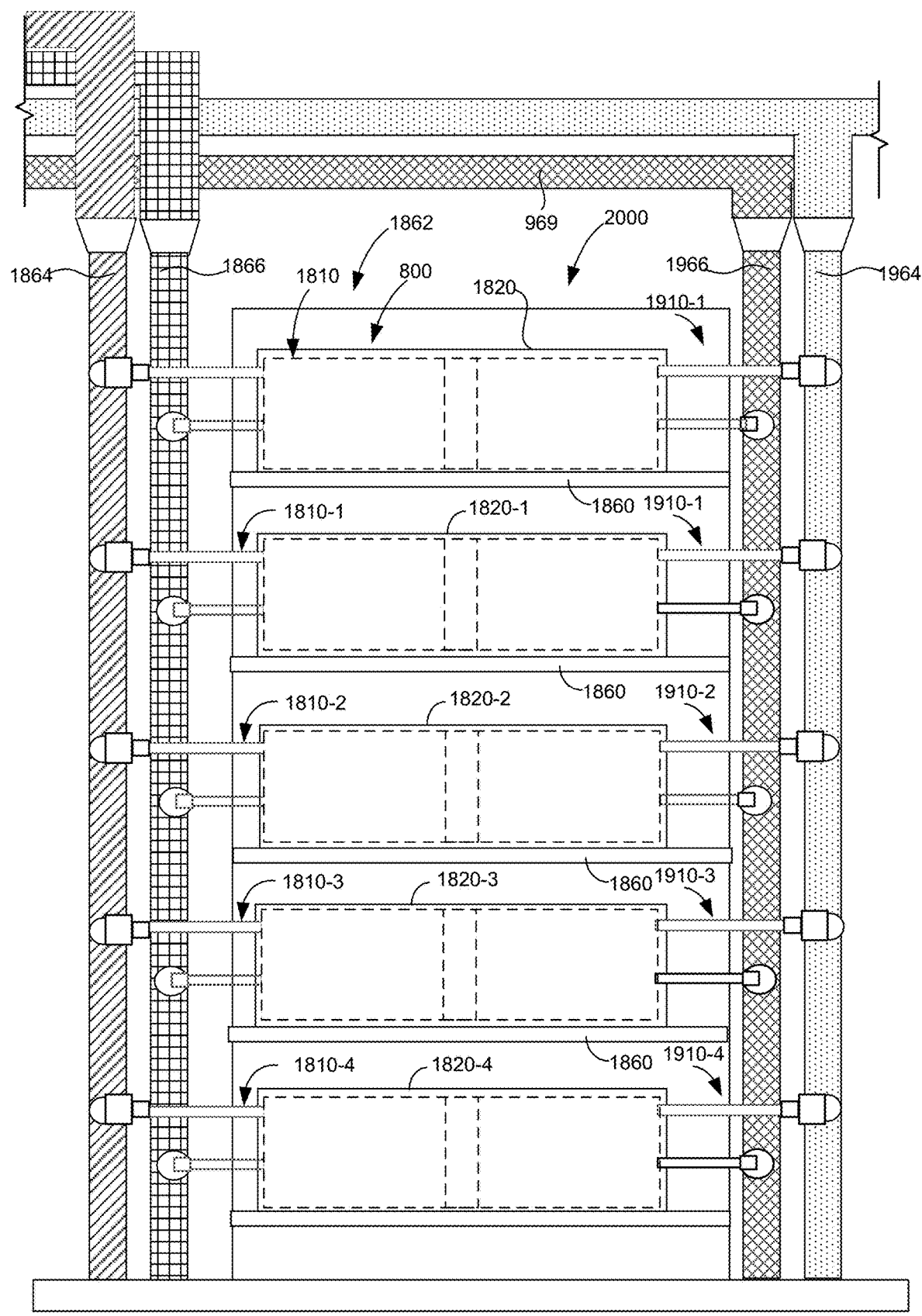
FIG. 15 is a schematic front view of an example system comprising the computing device and cooling loop assembly of FIG. 14 implemented within an example computing device rack, according to aspects of the disclosure.

FIG. 15 shows an example system that incorporates the system 1800 of FIG. 14 into a computing device rack system 2000. The system is otherwise similar to FIG. 12, and includes computing devices 1820,1820-1,1820-2,1820-3, 1820-4 on shelves 1860 of the computing device rack 1862. On one side of the computing devices 1820,1820-1,1820-2, 1820-3,182-4 and shelves 1860, the first loop assemblies 1810,1810-1,1810-2,1810-3,1810-4 are connected to the first rack supply manifold 1864 and the first rack return manifold 1866. On the other side of the computing devices 1820,1820-1,1820-2,1820-3,182-4, second loop assemblies 1910,1910-1,1910-2,1910-3,1910-4 are connected to the second rack supply manifold 1964 and the second rack return manifold 1966. The remaining components in the system are otherwise identical to the previous examples disclosed herein, including, for example, the configuration of the computing device rack system and the overall cooling distribution system respectively shown in FIGS. 11 through 13.

The redundant systems shown in FIGS. 11 through 15 provide a configuration that allows for multiple supply and return connectors for each computing device rack. Less pressure drop can be achieved across the systems, as well as enable rack level coolant supply redundancy. Furthermore, it is to be appreciated that redundant systems can incorporate any loop assembly configurations disclosed herein, as well as variations thereof.

Numerous variations of the aforementioned examples discussed in FIGS. 1-15 are within the scope of the disclosure. For example, any number of inlet connectors, outlet connectors, supply lines, return lines, secondary lines and manifolds may be utilized in various configurations relative to one or more cooling devices. The cooling devices may be further arranged in series, as opposed to being parallel to one another.

The rack supply and rack return manifolds may be provided on any side of the computing device rack, and any number of rack supply and rack return manifolds may be utilized. The number of rack supply and rack return manifolds in the system does not need to be equal, such that there may be more rack supply manifolds than rack return manifolds, and vice versa.

The computing devices in computing device racks in at least FIGS. 2, 5, 8, 12 and 15 are not limited to the example cooling loops 110 to 110-4, 210 to 210-4, 410 to 410-4, 810 to 810-4 used in the respective computing devices. Instead, all of the supply and return lines, secondary lines, and board manifolds within the cooling loop assembly may utilize lines that may vary in length so as to reach and connect with the rack supply manifold and rack return manifold. This allows for one cooling loop assembly to connect with any number of rack supply and rack return manifolds in various configurations. For example, the supply and return lines of the cooling loop assemblies of FIGS. 1, 4, 7, 10, 10A-10C and 11 can be flexible, to allow for connection to the rack supply manifolds (864,964,1864,1964) and rack return manifolds (866,966,1866,1966) of respective FIGS. 12 and 15.

Conventional liquid cooling systems rely on a single inlet to the loop assembly and a single outlet from the loop assembly for thermal management of components on a single board of a computing device. That is, at the shelf level, in some examples, only single supply and return lines and connectors are used to supply cooling liquid to components within computing devices in the system. In some examples, creasing the number of inlets and inlet connectors at the supply lines at the shelf level can improve thermal management of the computing devices, as well as improve overall efficiency and cost of the entire system. For example, using multiple inlet and outlet in parallel, reduces the flow rate in each inlet and outlet connectors, therefore reducing the pressure drop through the couplings. According to aspects of the disclosure, in some examples, this makes it possible to use smaller connectors on the rack manifold, which makes it easier for rack manifold manufacturing, reliability, and serviceability. Moreover, with small connectors in the system, lower force is required to connect and disconnect the quick disconnect couplings.

Figure 16:
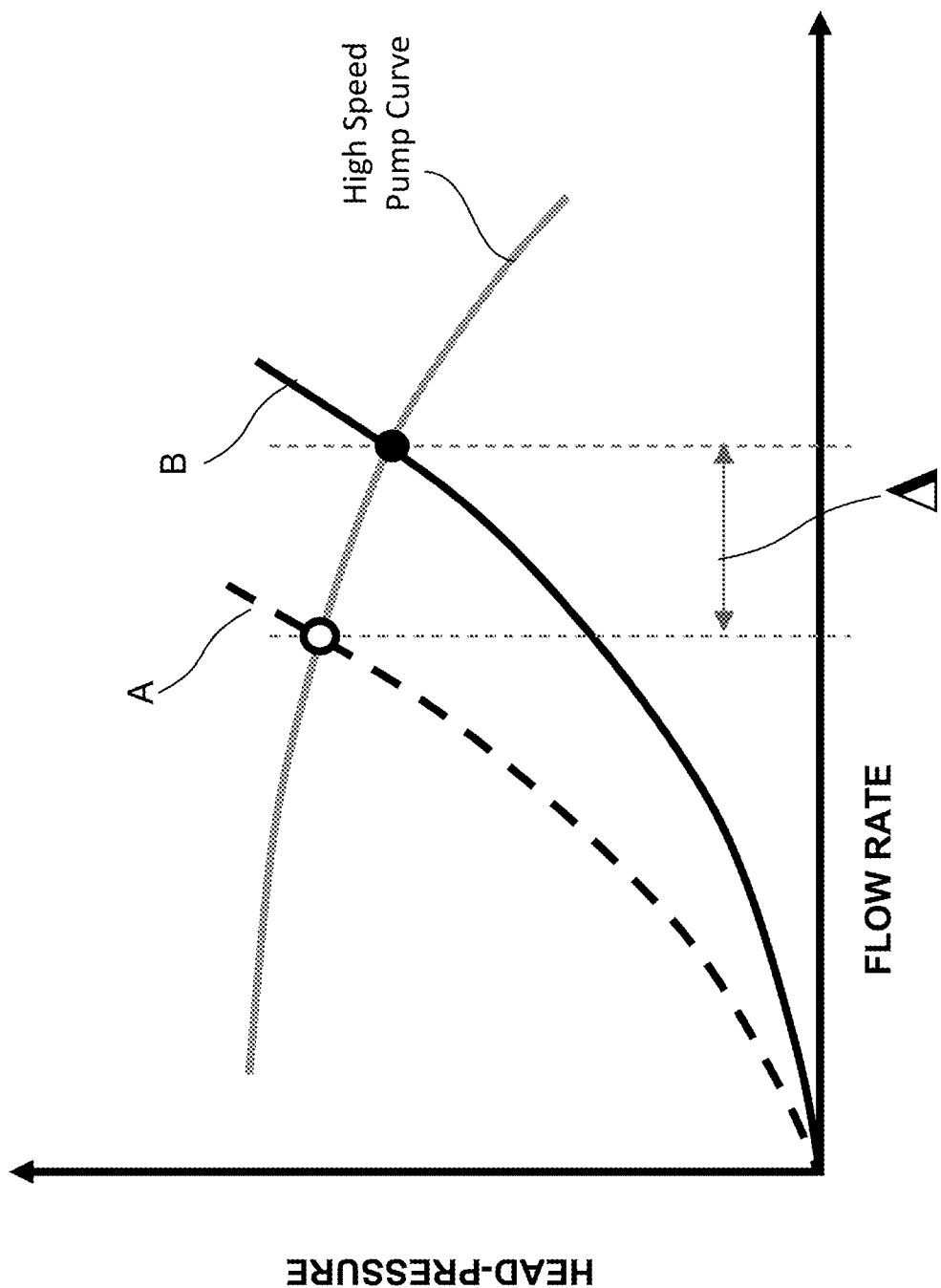
FIG. 16 is a head versus flow rate graph illustrating differences between prior art cooling systems and aspects of the disclosure.

FIG. 16 is a system chart comparing the pressure drop to flow rate of two systems. Curve A represents the flow rate to pressure for a system with only a single supply and return connections to a single cooling loop for each computing device on a shelf of a computing device rack. As shown, the higher the flow rate, the greater pressure that is required to move the fluid through the system. Curve B represents a system curve for a system that utilizes multiple inlet/outlet connections to a single loop for an individual circuit board of a computing device on a shelf such as the concepts and examples disclosed in FIGS. 1-14. As shown, increasing the number of connections and inlets at the shelf level reduces the pressure drop. For a given pump curve, an increase A in flow rate can therefore be achieved in a system with multiple inlet connections and outlet connections to a single loop, as compared to the flow rate of a system utilizing conventional single inlet and outlet connections to a single loop. Thus, using a system that utilizes multiple supply and return connections at the shelf level and to a single circuit board and loop can achieve increased flow rate at lower pressure for the overall system.

With reference to FIG. 17, the Head-Pressure curve to flow rate curve is identical to FIG. 16, except that a lower speed pump curve has also been added. This reflects that for the same flow rate achieved on Curve A (single inlet/outlet connections to a single loop for each board on a shelf in the system), the same flow rate is achieved on Curve B (multiple inlet/outlet connections to a single loop for each board on a shelf in the system) at a lower pump speed. With reference to the power-flow rate curve, this also means that less power is required to achieve the same flow rate. This amounts to a cost savings on cost to run the system, as well as wear and tear on the components utilizing the system. Further, smaller pumps can be utilized in the system design to save on overall cost.

The foregoing alternative examples are not mutually exclusive, but may be implemented in various combinations to achieve unique advantages. For example, cold plate loop supply and return design concepts and coolant distribution concepts can be interchanged among the different examples to meet the need for liquid cooling design optimization of specific applications. As these and other variations and combinations of the features discussed above can be utilized without departing from the subject matter defined by the claims, the foregoing description of the embodiments should be taken by way of illustration rather than by way of limitation of the subject matter defined by the claims. The provision of the examples described herein, as well as clauses phrased as "such as," "including" and the like, should not be interpreted as limiting the subject matter of the claims to the specific examples; rather, the examples are intended to illustrate only one of many possible embodiments.

The invention claimed is:

1. A system for thermal management of computing devices comprises:
   a central supply line coupled to a fluid source of cooling liquid;
   a central return line coupled to the fluid source;
   a rack supply manifold coupled to the central supply line;
   a rack return manifold coupled to the central return line; and
   a cooling loop assembly coupled to the rack supply manifold and the rack return manifold, the cooling loop assembly coupled to at least one cooling device, the at least one cooling device overlying a circuit board, the cooling loop assembly further comprising:
      multiple inlet connectors connected to the rack supply manifold; and
      multiple outlet connectors connected to the rack return manifold;
      a board outlet manifold overlying the circuit board, the board outlet manifold coupled to the multiple outlet connectors and the at least one cooling device;
      board return lines coupled to each of the multiple outlet connectors, the board return lines respectively coupling each of the respective multiple outlet connectors to the board outlet manifold; and
      a secondary return line coupling the board outlet manifold to the at least one cooling device,
   the multiple inlet connectors providing a passageway for the cooling liquid from the central supply line into the cooling loop assembly for distribution to the at least one cooling device, and the multiple outlet connectors providing a passageway to the rack return manifold for the cooling liquid exiting the at least one cooling device,
   wherein the cooling liquid that returns from the at least one cooling device flows through the board return lines and the multiple outlet connectors.

2. The system of claim 1, wherein each of the multiple inlet connectors is coupled to a board supply line that feeds fluid from the rack supply manifold into the cooling loop assembly and into the at least one cooling device.

3. The system of claim 2, wherein the cooling loop assembly comprises a board inlet manifold and a secondary supply lines, the secondary supply lines connecting the board inlet manifold to the at least one cooling device.

4. The system of claim 1, wherein the at least one cooling device is two or more cooling devices, and wherein the multiple inlet connectors are at least two inlet connectors.

5. The system of claim 1, wherein the multiple inlet connectors are at least two inlet connectors and the multiple outlet connectors are at least two outlet connectors.

6. The system of claim 4, wherein the rack supply manifold and the rack return manifold are positioned on opposed sides of the at least one cooling device.

7. The system of claim 4, wherein the rack supply manifold and the rack return manifold are positioned on a same side of the at least one cooling device.

8. The system of claim 1, wherein the multiple inlet connectors and the multiple outlet connectors are first multiple inlet connectors and first multiple outlet connectors, and the cooling loop assembly is a first cooling loop assembly, the system further comprising a second cooling loop assembly coupled to the rack supply manifold and the rack return manifold, the first cooling loop assembly overlying the second cooling loop assembly, the second cooling loop assembly coupled to at least one other cooling device connected to another circuit board.

9. The system of claim 1, wherein the rack supply manifold is a first rack supply manifold and the rack return manifold is a first rack return manifold, the system further comprising
   a second central supply line;
   a second central return line;
   a second rack supply manifold coupled to the second central supply line; and
   a second rack return manifold coupled to the second central return line,
   wherein at least one of the multiple inlet connectors is connected to the second rack supply manifold, and at least one of the multiple outlet connectors is connected to the second rack return manifold,
   the at least one of the multiple inlet connectors providing a passageway for the cooling liquid from the second central supply line into the cooling loop assembly for distribution to the at least one cooling device, and
   the at least one of the multiple outlet connectors providing a passageway to the second rack return manifold for the cooling liquid exiting the at least one of the cooling devices.

10. The system of claim 4, wherein the multiple inlet connectors and the multiple outlet connectors comprise quick disconnect couplings.

11. A system comprising:
a circuit board;
a plurality of microelectronic assemblies electronically connected to the circuit board;
a first cooling devices overlying a first microelectronic assembly and a second cooling device overlying a second microelectronic assembly, the first and second cooling devices configured to dissipate heat generated by the first and second microelectronic assemblies;
a cooling loop assembly coupled to the first and second cooling devices and overlying the circuit board, the cooling loop assembly comprising:
multiple inlet connectors configured to be coupled to an assembly fluid source external to the circuit board;
multiple outlet connectors configured to be coupled to an assembly return line external to the circuit board;
a board outlet manifold overlying the circuit board, the board outlet manifold coupled to the multiple outlet connectors and the first and second cooling devices;
outlet return lines respectively coupling each of the multiple outlet connectors to the board outlet manifold;
secondary return lines respectively coupling the first and second cooling devices to the board outlet manifold;
the multiple inlet connectors providing a passageway for cooling liquid from the assembly fluid source into the cooling loop assembly for distribution to the first and second cooling devices, and
the multiple outlet connectors providing a passageway to the assembly return line for the cooling liquid exiting the first and second cooling devices through the respective secondary return lines.

12. The system of claim 11, wherein the outlet return lines overlie the circuit board and wherein the cooling liquid returning from the first and second cooling devices flows through each of the outlet return lines and the multiple outlet connectors.

13. The system of claim 12, wherein the multiple inlet connectors and the multiple outlet connectors are quick disconnect couplings.

14. A system for thermal management of computing devices comprising:
a rack supply manifold connected to a supply line;
a rack return manifold connected to a central return line;
a first cooling loop assembly coupled to the rack supply manifold and the rack return manifold, the first cooling loop assembly coupled to at least one cooling device, the at least one cooling device overlying a first circuit board, the first cooling loop assembly comprising:
at least one inlet connector coupled to the rack supply manifold, the at least one inlet connector providing a passageway for cooling liquid from the rack supply manifold into the first cooling loop assembly for distribution to the at least one cooling device;
a plurality of outlet connectors coupled to the rack return manifold, the plurality of outlet connectors providing a passageway for cooling liquid exiting the at least one cooling device to the rack return manifold,
a board outlet manifold overlying the first circuit board, the board outlet manifold coupled to the plurality of outlet connectors and the at least one cooling device;
board return lines respectively coupling the board outlet manifold to the plurality of outlet connectors;
a secondary return line coupling the board outlet manifold to the at least one cooling device;
a second cooling loop assembly coupled to the rack supply manifold and the rack return manifold, the second cooling loop assembly coupled to at least one other cooling device connected to a second circuit board, the second cooling loop assembly comprising:
at least one inlet connector of the second cooling loop assembly coupled to the rack supply manifold, the at least one inlet connector providing a passageway for the cooling liquid from the rack supply manifold into the second cooling loop assembly for distribution to the at least one other cooling device; and
a plurality of outlet connectors of the second cooling loop assembly coupled to the rack return manifold, the plurality of outlet connectors providing a passageway to the rack return manifold for the cooling liquid exiting the at least one other cooling device.

15. The system of claim 14, wherein the at least one inlet connector of the first cooling loop assembly comprises a first plurality of inlet connectors and the at least one inlet connector of the second cooling loop assembly comprises a second plurality of inlet connectors.

16. The system of claim 1, wherein the at least one cooling device is a plurality of cooling devices, and the secondary return line is a plurality of secondary return lines, each of the plurality of cooling devices coupled to the board outlet manifold by a respective one of the plurality of secondary return lines.

17. The system of claim 1, wherein the at least one cooling device is two or more cooling devices, the multiple outlet connectors are at least two or more outlet connectors, and the secondary return line is a plurality of secondary return lines, and wherein each of the plurality of secondary return lines couples the board outlet manifold to a respective cooling device of the at least two or more cooling devices.

18. The system of claim 12, further comprising a board supply manifold overlying the circuit board, inlet supply lines respectively coupling each of the multiple inlet connectors to the board supply manifold; and secondary supply lines respectively coupling the first and second cooling devices to the board supply manifold.

* * * * *